United States Patent
Hong et al.

(10) Patent No.: US 8,634,511 B2
(45) Date of Patent: Jan. 21, 2014

(54) DIGITAL PHASE FREQUENCY DETECTOR, DIGITAL PHASE LOCKED LOOP INCLUDING THE SAME AND METHOD OF DETECTING PHASE AND FREQUENCY OF OUTPUT SIGNAL

(75) Inventors: Jong-Phil Hong, Hwaseong-si (KR);
Ji-Hyun Kim, Hwaseong-si (KR);
Jae-Jin Park, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 220 days.

(21) Appl. No.: 13/315,476

(22) Filed: Dec. 9, 2011

(65) Prior Publication Data
US 2012/0183104 A1    Jul. 19, 2012

(30) Foreign Application Priority Data
Jan. 13, 2011 (KR) .................. 10-2011-0003401

(51) Int. Cl.
*H04L 7/00* (2006.01)
(52) U.S. Cl.
USPC ........... 375/371; 375/375; 375/376; 327/146; 327/147; 327/155; 327/156
(58) Field of Classification Search
USPC .......... 375/354, 371, 373, 375, 376; 327/141, 327/146, 147, 155, 156, 162
See application file for complete search history.

(56) References Cited

U.S. PATENT DOCUMENTS

| | | | |
|---|---|---|---|
| 6,959,061 B1 * | 10/2005 | Kuwata .................... | 375/373 |
| 7,595,699 B1 | 9/2009 | Schlueter et al. | |
| 7,728,675 B1 | 6/2010 | Kennedy et al. | |
| 2004/0178834 A1 * | 9/2004 | Lee .......................... | 327/156 |
| 2004/0202271 A1 * | 10/2004 | Fahim ...................... | 375/376 |
| 2008/0111597 A1 * | 5/2008 | Cranford et al. ........ | 327/156 |
| 2008/0136535 A1 | 6/2008 | Khorram | |
| 2010/0164633 A1 | 7/2010 | Hoshino et al. | |

FOREIGN PATENT DOCUMENTS

JP    2010-154270    7/2010

* cited by examiner

*Primary Examiner* — Dac Ha
(74) *Attorney, Agent, or Firm* — F. Chau & Associates, LLC

(57) ABSTRACT

A digital phase frequency detector includes a detection unit, a reset unit and a phase comparison unit. The detection unit detects edges of a reference signal and a feedback input signal to generate a reference edge signal and a feedback edge signal. The reset unit generates a reset signal resetting the detection unit based upon the reference edge signal and the feedback edge signal. The phase comparison unit generates first and second phase comparison signals based upon the reference edge signal and the feedback edge signal. The phase comparison unit includes a first flip-flop generating a first comparison signal based upon the reference edge signal and the feedback edge signal, a second flip-flop generating a second comparison signal based upon the reference edge signal and the feedback edge signal, and a latch block latching the first and second comparison signals to generate the first and second phase comparison signals.

24 Claims, 30 Drawing Sheets

DIGITAL PHASE FREQUENCY DETECTOR, DIGITAL PHASE LOCKED LOOP INCLUDING THE SAME AND METHOD OF DETECTING PHASE AND FREQUENCY OF OUTPUT SIGNAL

CROSS-REFERENCE TO RELATED APPLICATION

This application claims under 35 USC §119 priority to and the benefit of Korean Patent Application No. 2011-0003401, filed on Jan. 13, 2011 in the Korean Intellectual Property Office (KIPO), the entire contents of which are incorporated by reference herein.

BACKGROUND

1. Technical Field

The present disclosure relates to a phase frequency detector, and, more particularly, to a digital phase frequency detector (PFD), a digital phase locked loop (PLL) including the digital phase frequency detector and a method of digitally detecting a phase and a frequency of an output signal.

2. Discussion of the Related Art

A phase locked loop (PLL) is widely used to generate a signal having a fixed phase and a fixed frequency. A conventional PLL is implemented by analog circuits that include a phase frequency detector (PFD) which compares the phase of two input signals, a charge pump, a loop filter, a voltage controlled oscillator and a divider. However, the conventional analog PLL typically provides low accuracy and has high sensitivity to external noises. To avoid these analog circuit issues, a digital PLL that is implemented by digital circuits has been proposed. Usually, in the digital PLL, a digital PFD corresponding to the PFD of the analog PLL is used. The performance of the digital PLL depends upon the performance of the digital PFD. A need exists for a PFD that not only has a relatively small size and high operating speed, but can accurately detect the phase and frequency of an output signal.

SUMMARY

According to exemplary embodiments of the inventive concept a digital phase frequency detector (PFD) capable of accurately detecting a phase and a frequency of an output signal, and having relatively small size and high operating speed is provided.

Exemplary embodiments also provide a digital phase locked loop (PLL) including the digital PFD, and capable of effectively locking a phase and a frequency of an output signal Exemplary embodiments further provide a method of detecting a phase and a frequency of an output signal.

According to an exemplary embodiment a digital phase frequency detector (PFD) is provided. A detection unit is configured to detect an edge of a reference signal and an edge of a feedback input signal to generate a reference edge signal and a feedback edge signal/. A reset unit is configured to generate a reset signal that resets the detection unit based upon the reference edge signal and the feedback edge signal. A phase comparison unit is configured to generate a first phase comparison signal and a second phase comparison signal based upon the reference edge signal and the feedback edge signal. The phase comparison unit includes a first flip-flop having a data input terminal configured to receive the reference edge signal and a clock input terminal configured to receive the feedback edge signal, and configured to generate a first comparison signal based upon the reference edge signal and the feedback edge signal, a second flip-flop having a data input terminal configured to receive the feedback edge signal and a clock input terminal configured to receive the reference edge signal, and configured to generate a second comparison signal based upon the reference edge signal and the feedback edge signal, and a latch block configured to latch the first comparison signal and the second comparison signal to generate the first phase comparison signal and the second phase comparison signal.

Activation of the first phase comparison signal and the second phase comparison signal may complement each other. The first phase comparison signal may be activated when a phase of the feedback input signal lags a phase of the reference signal, and the second phase comparison signal may be activated when a phase of the feedback input signal leads a phase of the reference signal.

The first phase comparison signal may be synchronized with the feedback edge signal such that a logic level of the first phase comparison signal is determined corresponding to a logic level of the reference edge signal at an activation timing of the feedback edge signal, and the second phase comparison signal may be synchronized with the reference edge signal such that a logic level of the second phase comparison signal is determined corresponding to a logic level of the feedback edge signal at an activation timing of the reference edge signal. The reset signal may be activated when both the reference edge signal and the feedback edge signal are activated, and the reference edge signal and the feedback edge signal are deactivated after the reset signal is activated.

The detection unit may include a third flip-flop configured to generate the reference edge signal based upon the reference signal and the reset signal, the reference edge signal being activated in response to one of a rising edge and a falling edge of the reference signal and being deactivated in response to the reset signal, and a fourth flip-flop configured to generate the feedback edge signal based upon the feedback input signal and the reset signal, the feedback edge signal being activated in response to one of a rising edge and a falling edge of the feedback input signal and being deactivated in response to the reset signal.

The reset unit may include at least one logic element configured to perform a logic operation on the reference edge signal, the feedback edge signal and a detection enable signal to generate the reset signal.

The digital PFD may further include a synchronization unit configured to synchronize the first phase comparison signal and the second phase comparison signal with one of the reference signal and the feedback input signal to generate a first phase comparison output signal and a second phase comparison output signal.

The synchronization unit may includes a third flip-flop having a data input terminal configured to receive the first phase comparison signal and a clock input terminal configured to receive the one of the reference signal and the feedback input signal, and configured to generate the first phase comparison output signal based upon the first phase comparison signal and the one of the reference signal and the feedback input signal, and a second flip-flop having a data input terminal configured to receive the second phase comparison signal and a clock input terminal configured to receive the one of the reference signal and the feedback input signal, and configured to generate the second comparison output signal based upon the second phase comparison signal and the one of the reference signal and the feedback input signal.

According to an exemplary embodiment a digital phase frequency detector (PFD) includes a reference signal generation unit configured to generate a lead reference signal, a reference signal and a lag reference signal based upon an input signal, a phase comparison signal generation unit configured to generate a reference edge signal and a feedback edge signal based upon the reference signal and a feedback input signal, and configured to generate a first phase comparison signal and a second phase comparison signal based upon the reference edge signal and the feedback edge signal, the first and second phase comparison signals indicative as to whether a phase of the feedback input signal leads or lags a phase of the reference signal, and a gain control unit configured to generate a high gain signal based upon the lead reference signal, the lag reference signal, the reference edge signal and the feedback edge signal, the high gain signal indicative as to whether a phase difference between the reference signal and the feedback input signal is greater than a predetermined phase difference.

A phase of the lead reference signal may lead the phase of the reference signal. A phase of the lag reference signal may lag the phase of the reference signal, and the high gain signal may be activated when the phase of the feedback input signal leads the phase of the lead reference signal or lags the phase of the lag reference signal.

The gain control unit may includes a lead detection unit configured to generate a high lead signal based upon the lead reference signal, the reference edge signal and the feedback edge signal, the high lead signal indicative as to the phase of the feedback input signal leads a phase of the lead reference signal, a lag detection unit configured to generate a high lag signal based upon the lag reference signal, the reference edge signal and the feedback edge signal, the high lag signal indicative as to whether the phase of the feedback input signal lags a phase of the lag reference signal, and a high gain signal generation unit configured to generate the high gain signal based upon the high lead signal and the high lag signal.

The lead detection unit may include a lead detection block configured to detect an edge of the lead reference signal to generate a lead edge signal, a logic operation block configured to perform a logic operation on the lead edge signal, the reference edge signal and the feedback edge signal to generate a lead signal, and a lead output block configured to synchronize the lead signal with the lead edge signal to generate the high lead signal.

The lag detection unit may include a lag detection block configured to detect an edge of the lag reference signal to generate a lag edge signal, a logic operation block configured to perform a logic operation on the lag edge signal, the reference edge signal and the feedback edge signal to generate a lag signal, and a lag output block configured to synchronize the lag signal with the lag edge signal to generate the high lag signal.

The gain control unit may further include a gain synchronization unit configured to synchronize the high gain signal with one of the reference signal and the feedback input signal to generate a high gain output signal.

The lead reference signal may include first through n-th lead reference signals, where n is a natural number equal to or greater than two, and a phase of a k-th lead reference signal leads a phase of a (k−1)-th lead reference signal by an unit phase, where k is a natural number equal to or greater than two and equal to or less than n. The lag reference signal may include first through n-th lag reference signals, and a phase of a k-th lag reference signal lags a phase of a (k−1)-th lag reference signal by the unit phase.

The gain control unit may include first through n-th lead detection units, each lead detection unit configured to generate a respective one of first through n-th high lead signals based upon a respective one of the first through n-th lead reference signals, the reference edge signal and the feedback edge signal, each high lead signal indicative as to whether the phase of the feedback input signal leads a phase of the respective one of the first through n-th lead reference signals, first through n-th lag detection units, each lag detection unit configured to generate a respective one of first through n-th high lag signals based upon a respective one of the first through n-th lag reference signals, the reference edge signal and the feedback edge signal, each high lag signal indicative as to the phase of the feedback input signal lags a phase of the respective one of the first through n-th lag reference signals, and first through n-th high gain signal generation units, each high gain signal generation unit configured to generate a respective one of first through n-th high gain signals based upon the respective one of the first through n-th high lead signals and the respective one of the first through n-th high lag signals.

The phase comparison signal generation unit may be configured to generate a reference edge signal and a feedback edge signal by detecting an edge of the reference signal and an edge of the feedback input signal, to synchronize the first phase comparison signal with the feedback edge signal such that a logic level of the first phase comparison signal corresponds to a logic level of the reference edge signal at an activation timing of the feedback edge signal, and to synchronize the second phase comparison signal with the reference edge signal such that a logic level of the second phase comparison signal corresponds to a logic level of the feedback edge signal at an activation timing of the reference edge signal.

The digital PFD may further include a gain selection unit configured to generate a selection gain signal based upon the high gain signal, and based upon one of the first phase comparison signal and the second phase comparison signal, wherein the selection gain signal has a first digital value when the high gain signal is deactivated, and has a second digital value when the high gain signal is activated, a magnitude of the second digital value being greater than a magnitude of the first digital value.

According to an exemplary embodiment a method of detecting a phase and a frequency of an output signal is provided. A lead reference signal, a reference signal and a lag reference signal are generated based upon an input signal. A reference edge signal and a feedback edge signal are generated based upon the reference signal and a feedback input signal. A high lead signal is generated based upon the lead reference signal, the reference edge signal and the feedback edge signal, the high lead signal indicative as to a phase of the feedback input signal leads a phase of the lead reference signal. A high lag signal is generated based upon the lag reference signal, the reference edge signal and the feedback edge signal, the high lag signal indicative as to the phase of the feedback input signal lags a phase of the lag reference signal. A high gain signal is generated based upon the lead reference signal, the lag reference signal, the reference edge signal and the feedback edge signal, the high gain signal indicative as to whether the feedback input signal is compensated based upon an unit gain or an adjusted gain being greater than the unit gain.

The high gain signal may be activated when the phase of the feedback input signal leads the phase of the lead reference signal or lags the phase of the lag reference signal, and the method may further include generating a selection gain signal based upon the high gain signal. The selection gain signal may correspond to the adjusted gain when the high gain signal is activated and corresponds to the unit gain when the high gain signal is deactivated.

According to an exemplary embodiment a digital phase locked loop (PLL) is provided. A digital phase frequency detector (PFD) is configured to generate a first phase comparison signal and a second phase comparison signal based upon a reference signal and a feedback input signal, the first and second phase comparison signals indicative as to whether a phase of the feedback input signal leads or lags a phase of the reference signal. A digital loop filter is configured to generate a digital control signal for adjusting a phase and a frequency of an output signal based upon the first phase comparison signal and the second phase comparison signal. A digitally controlled oscillator is configured to generate the output signal based upon the digital control signal. A divider configured to divide the output signal to generate the feedback input signal, The digital PFD includes a detection unit configured to detect an edge of the reference signal and an edge of the feedback input signal to generate a reference edge signal and a feedback edge signal, a reset unit configured to generate a reset signal to reset the detection unit based upon the reference edge signal and the feedback edge signal, a first flip-flop having a data input terminal configured to receive the reference edge signal and a clock input terminal configured to receive the feedback edge signal, and configured to generate a first comparison signal based upon the reference edge signal and the feedback edge signal, a second flip-flop having a data input terminal configured to receive the feedback edge signal and a clock input terminal configured to receive the reference edge signal, and configured to generate a second comparison signal based upon the reference edge signal and the feedback edge signal, and a latch unit configured to latch the first comparison signal and the second comparison signal to generate the first phase comparison signal and the second phase comparison signal.

According to an exemplary embodiment a digital phase locked loop (PLL) includes a digital phase frequency detector (PFD) configured to generate a lead reference signal, a reference signal and a lag reference signal based upon an input signal, to generate a reference edge signal and a feedback edge signal based upon the reference signal and a feedback input signal, to generate a first phase comparison signal and a second phase comparison signal based upon the reference edge signal and the feedback edge signal, and to generate a high gain signal based upon the lead reference signal, the lag reference signal, the reference edge signal and the feedback edge signal, the first and second phase comparison signals indicative as to whether a phase of the feedback input signal leads or lags a phase of the reference signal, and the high gain signal indicative as to whether a phase difference between the reference signal and the feedback input signal is greater than a predetermined phase difference. A digital loop filter is configured to generate a digital control signal for adjusting a phase and a frequency of an output signal based upon the high gain signal, the first phase comparison signal and the second phase comparison signal. A digitally controlled oscillator (DCO) is configured to generate the output signal based upon the digital control signal. A divider configured to divide the output signal to generate the feedback input signal.

An initial slope angle of a frequency versus time relationship of the output signal may be greater than a final slope angle of frequency versus time relationship of the output signal.

The digital PLL may further include an automatic frequency controller configured to generate an automatic digital control signal that adjusts an initial frequency of the output signal based upon the reference signal and the feedback input signal.

According to an exemplary embodiment a digital phase frequency detector for controlling a digital phase locked loop is provided. A phase comparison signal generation unit is configured to generate a first phase comparison signal and a second phase comparison signal in response to a reference signal and a feedback signal of the phase locked loop, the first phase comparison signal being indicative as to a phase of the feedback signal lagging the reference signal and the second phase comparison signal being indicative as to a phase of the feedback signal leading the phase of the reference signal. A gain control unit configured to generate a high gain signal in response to a lead reference signal and a lag reference signal, the high gain signal being indicative as to whether a phase difference between the reference signal and the feedback signal is greater than a predetermined phase difference. A gain selection unit is configured to generate a selection gain signal based upon the high gain signal, and based upon one of the first phase comparison signal and the second phase comparison signal. The selection gain signal has a first digital value when the high gain signal is deactivated, and has a second digital value when the high gain signal is activated, a magnitude of the second digital value being greater than a magnitude of the first digital value. The first digital value and second digital value are configured to control an adjustment of a phase and frequency of an output signal and the feedback signal of the phase locked loop.

BRIEF DESCRIPTION OF THE DRAWINGS

Illustrative, non-limiting exemplary embodiments will be more clearly understood from the following detailed description taken in conjunction with the accompanying drawings.

Like reference numerals refer to like elements throughout this application.

DETAILED DESCRIPTION OF THE EXEMPLARY EMBODIMENTS

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Figure 1:
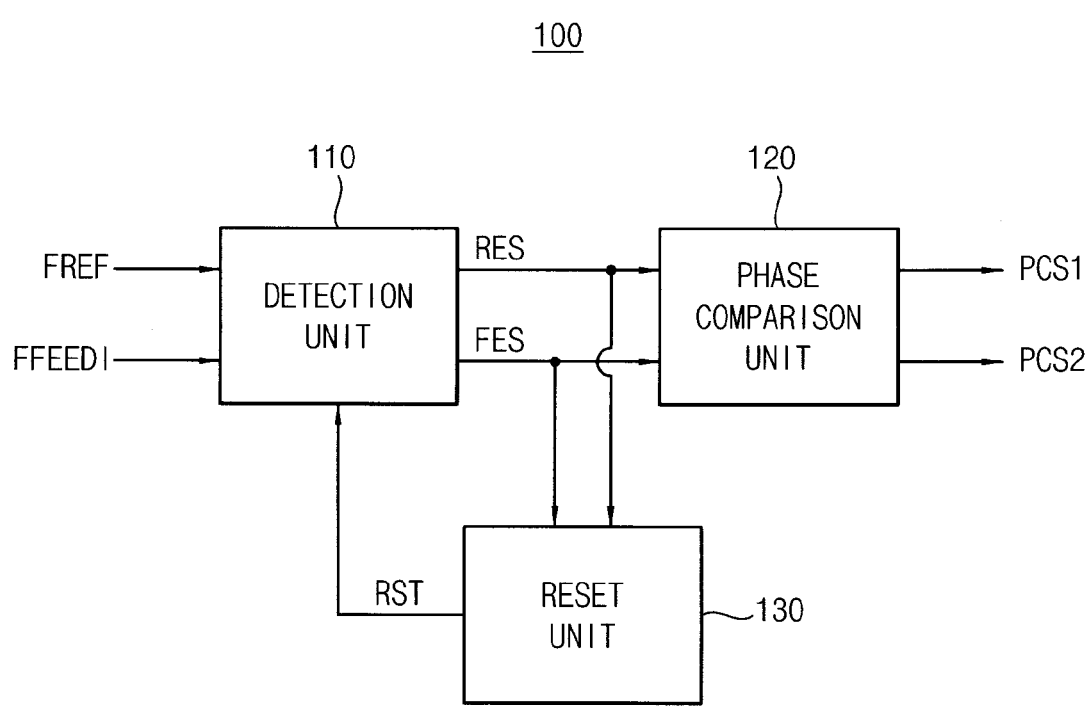
FIG. 1 is a block diagram illustrating a digital phase frequency detector (PFD) according to an exemplary embodiment.

FIG. 1 is a block diagram illustrating a digital phase frequency detector (PFD) according to an exemplary embodiment. A digital PFD 100 includes a detection unit 110, a phase comparison unit 120 and a reset unit 130.

The digital PFD 100 according to some exemplary embodiments may be employed in a digital phase locked loop (PLL). The digital PLL may detect a phase and a frequency of an output signal (i.e., detect a phase difference and a frequency difference between an input signal and the output signal) by using the digital PFD 100, and may adjust the phase and the frequency of the output signal based upon the detection result to lock the phase and the frequency of the output signal.

The detection unit 110 detects an edge (e.g. a rising edge or a falling edge) of a reference signal FREF and an edge of a feedback input signal FFEEDI to generate a reference edge signal RES and a feedback edge signal FES. For example, the detection unit 110 detects the edge of the reference signal FREF to generate the reference edge signal RES, and detects the edge of the feedback input signal FFEEDI to generate the feedback edge signal FES.

The reference signal FREF may correspond to the input signal of a digital PLL that includes the digital PFD 100, and the feedback input signal FFEEDI may correspond to the output signal of the digital PLL. For example, the reference signal FREF may be substantially the same as the input signal of the digital PLL or may be generated by delaying the input signal of the digital PLL. The feedback input signal FFEEDI may be substantially the same as the output signal of the digital PLL or may be generated by dividing the output signal of the digital PLL. The reference signal FREF may be generated by a crystal oscillator that uses a crystal material, and may have a fixed frequency. Thus, the frequency of the reference signal FREF may be used as a reference frequency for a frequency of the feedback input signal FFEEDI.

In an exemplary embodiment, the reference edge signal RES may be activated in response to one of a rising edge and a falling edge of the reference signal FREF, and the feedback edge signal FES may be activated in response to one of a rising edge and a falling edge of the feedback input signal FFEEDI. For example, if the reference edge signal RES is activated in response to the rising edge of the reference signal FREF, the feedback edge signal FES may be activated in response to the rising edge of the feedback input signal FFEEDI. If the reference edge signal RES is activated in response to the falling edge of the reference signal FREF, the feedback edge signal FES may be activated in response to the falling edge of the feedback input signal FFEEDI. The reference edge signal RES and the feedback edge signal FES may be deactivated in response to a reset signal RST, respectively.

As used herein, the terms "activated" and "activation" may indicate that a signal is transitioned from a first logic level to a second logic level, and the terms "deactivated" and "deactivation" may indicate that the signal is transitioned from the second logic level to the first logic level. The first logic level may be a logic low level, and the second logic level may be a logic high level.

The phase comparison unit 120 generates a first phase comparison signal PCS1 and a second phase comparison signal PCS2 based upon the reference edge signal RES and the feedback edge signal FES. The first and second phase comparison signals PCS1, PCS2 may indicate a phase difference and a frequency difference between of the feedback input signal FFEEDI and the reference signal FREF. In other words, the first and second phase comparison signals PCS1, PCS2 may indicate whether a phase of the feedback input signal FFEEDI leads or lags a phase of the reference signal FREF. For example, the first phase comparison signal PCS1 may indicates whether the phase of the feedback input signal FFEEDI lags the phase of the reference signal FREF, and the second phase comparison signal PCS2 may indicates whether the phase of the feedback input signal FFEEDI leads the phase of the reference signal FREF.

In an exemplary embodiment, the first phase comparison signal PCS1 and the second phase comparison signal PCS2 may be activated in conjunction with each other. The logic level of the first phase comparison signal PCS1 may complement the logic level of the second phase comparison signal PCS2. For example, when the phase of the feedback input signal FFEEDI lags the phase of the reference signal FREF, the first phase comparison signal PCS1 may be activated, and the second phase comparison signal PCS2 may be deactivated. When the phase of the feedback input signal FFEEDI leads the phase of the reference signal FREF, the second phase comparison signal PCS2 may be activated, and the first phase comparison signal PCS1 may be deactivated.

In an exemplary embodiment, the digital PFD 100 may be implemented with a bang-bang digital PFD (BBDPFD) that detects a phase difference and a frequency difference between the reference signal FREF and the feedback input signal FFEEDI to output the detection result having a form of binary code.

Figure 2:
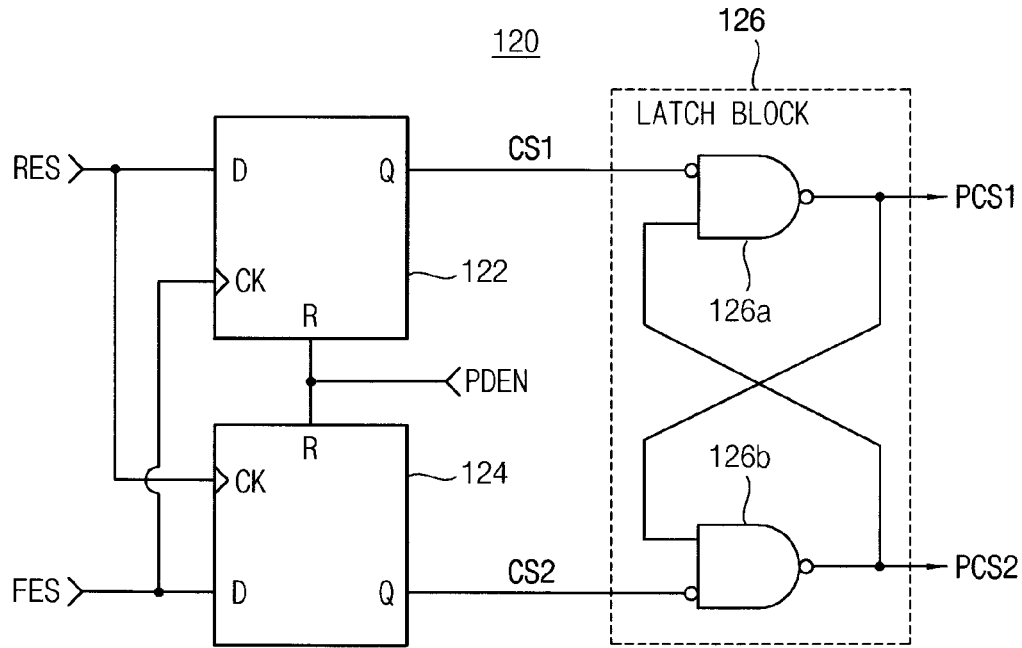
FIG. 2 is a block diagram illustrating an example of a phase comparison unit included in the digital PFD of FIG. 1.

FIG. 2 is a block diagram illustrating an example of a phase comparison unit included in the digital PFD of FIG. 1. The phase comparison unit 120 includes a first flip-flop 122, a second flip-flop 124 and a latch block 126.

The first flip-flop 122 has a data input terminal receiving the reference edge signal RES and a clock input terminal receiving the feedback edge signal FES, and generates a first comparison signal CS1 based upon the reference edge signal RES and the feedback edge signal FES. For example, the first flip-flop 122 may sample a logic level of the reference edge signal RES when the feedback edge signal FES is activated to generate the first comparison signal CS1, and thus a logic level of the first comparison signal CS1 may correspond to the logic level of the reference edge signal RES at an activation timing of the feedback edge signal FES.

The second flip-flop 124 has a data input terminal receiving the feedback edge signal FES and a clock input terminal receiving the reference edge signal RES, and generates a second comparison signal CS2 based upon the reference edge signal RES and the feedback edge signal FES. For example, the second flip-flop 122 may sample a logic level of the feedback edge signal FES when the reference edge signal RES is activated to generate the second comparison signal CS2, and thus a logic level of the second comparison signal CS2 may correspond to the logic level of the feedback edge signal FES at an activation timing of the reference edge signal RES. The first and second flip-flops 122, 124 may be D flip-flops, respectively.

Each of the first and second flip-flops 122, 124 may have a reset input terminal receiving a detection enable signal PDEN. The detection enable signal PDEN may be activated when the digital PFD 100 performs the phase and the frequency detection operations, and may be deactivated when the phase and the frequency of the output signal of the digital PLL including the digital PFD 100 is locked and such detection operations are finished.

The latch block 126 latches the first comparison signal CS1 and the second comparison signal CS2 to generate the first phase comparison signal PCS1 and the second phase comparison signal PCS2. The latch block 126 may be implemented with a SR latch, and may include a first NAND gate 126a and a second NAND gate 126b. The first NAND gate 126a may perform a NAND operation on an inversion signal of the first comparison signal CS1 and the second phase comparison signal PCS2 to generate the first phase comparison signal PCS1. The second NAND gate 126b may perform the NAND operation on an inversion signal of the second comparison signal CS2 and the first phase comparison signal PCS1 to generate the second phase comparison signal PCS2.

In an exemplary embodiment, if one of the first and second comparison signals CS1, CS2 is activated, in other words, if the phase of the feedback input signal FFEEDI leads or lags the phase of the reference signal FREF, the first and second phase comparison signals PCS1, PCS2 may correspond to the first and second comparison signals CS1, CS2, respectively. For example, the first phase comparison signal PCS1 may be substantially the same as the first comparison signal CS1, and the second phase comparison signal PCS2 may be substantially the same as the second comparison signal CS2. The first phase comparison signal PCS1 may be synchronized with the feedback edge signal FES, and the second phase comparison signal CS2 may be synchronized with the reference edge signal RES. The phase comparison unit 120 may sample the logic level of the reference edge signal RES to generate the first phase comparison signal PCS1 when the feedback edge signal FES is activated, and may sample the logic level of the feedback edge signal FES to generate the second phase comparison signal PCS2 when the reference edge signal RES is activated. Thus, the logic level of the first phase comparison signal PCS1 may correspond to the logic level of the reference edge signal RES at the activation timing of the feedback edge signal FES, and the logic level of the second phase comparison signal PCS2 may correspond to the logic level of the feedback edge signal FES at the activation timing of the reference edge signal RES.

In another exemplary embodiment, if both the first and second comparison signals CS1, CS2 are deactivated, in other words, if the phase of the feedback input signal FFEEDI is substantially the same as the phase of the reference signal FREF, the first and second phase comparison signals PCS1, PCS2 may correspond to previous phase comparison signals that are received prior to the currently received phase comparison signals, respectively. For example, both the logic level of the first phase comparison signal PCS1 and the logic level of the second phase comparison signal PCS2 may be maintained to the previous logic level, respectively.

Referring back to FIG. 1, the reset unit 130 generates the reset signal RST resetting the detection unit 110 based upon the reference edge signal RES and the feedback edge signal FES. For example, the reset signal RST may be activated when both the reference edge signal RES and the feedback edge signal FES are activated. The reference edge signal RES and the feedback edge signal FES may be deactivated after the reset signal RST is activated, and thus the detection unit 110 may be ready to detect an edge in a next period of the reference signal FREF and an edge in a next period of the feedback input signal FFEEDI.

In an exemplary embodiment, the reset signal RST may be asynchronously activated. For example, the reset signal RST may be activated after both the reference edge signal RES and the feedback edge signal FES are activated and a predetermined delay time interval has elapsed. Due to such asynchronous operation of the reset unit 130, the digital PFD 100 may have a substantially infinite dynamic range for the phase detection operation, and may simultaneously perform the phase detection operation and the frequency detection operation.

In the digital PFD 100 according to an exemplary embodiment, the phase comparison unit 120 includes the first and second flip-flops 122, 124 such that a clock input signal (i.e., the feedback edge signal FES) of the first flip-flop 122 is substantially the same as a data input signal of the second flip-flop 124, and a data input signal (i.e., the reference edge signal RES) of the first flip-flop 122 is substantially the same as a clock input signal of the second flip-flop 124. The phase comparison unit 120 may sample the logic level of the reference edge signal RES in response to the feedback edge signal FES to generate the first phase comparison signal PCS1, and may sample the logic level of the feedback edge signal FES in response to the reference edge signal RES to generate the second phase comparison signal PCS2. Thus, the digital PFD 100 may have a relatively simple structure and a high operating speed, and may accurately detect a phase difference and a frequency difference between the reference signal FREF and the feedback input signal FFEEDI.

If a phase difference between a feedback input signal and a reference signal is very small, a conventional digital PFD does not detect the phase difference, both first and second phase comparison signals may be deactivated, and the conventional digital PFD is in a so-called "metastable state" (i.e., an extended stability). The conventional digital PFD requires additional processes or elements for processing the metastable state. However, in the digital PFD 100 according to an exemplary embodiment of the present inventive concept, the phase comparison unit 120 includes the latch block 126. The latch block 126 prevents the metastable state by maintaining the logic levels of the first and second phase comparison signals PCS1, PCS2 at the previous logic levels when both the first and second comparison signals CS1, CS2 are deactivated, and the logic level of the first phase comparison signal PCS1 may complement the logic level of the second phase comparison signal PCS2 even though the phase of the feedback input signal FFEEDI is substantially the same as the phase of the reference signal FREF. Thus, the digital PFD 100 may have relatively high operational reliability and high operational stability.

Figure 3:
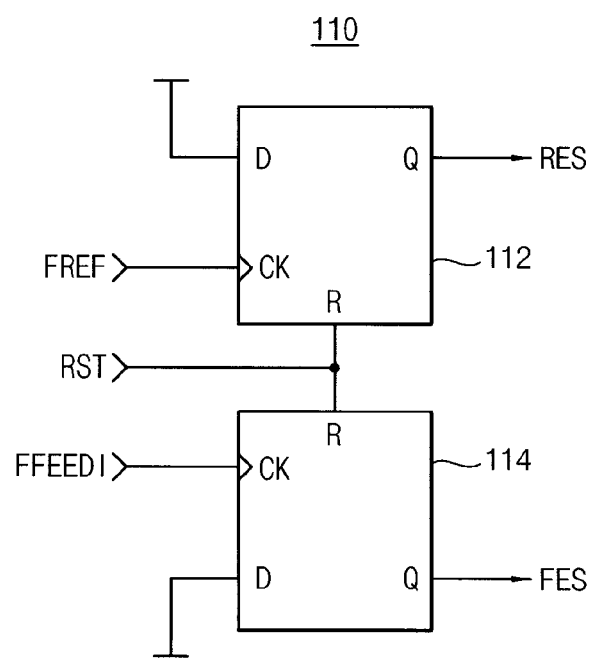
FIG. 3 is a block diagram illustrating an example of a detection unit included in the digital PFD of FIG. 1.

FIG. 3 is a block diagram illustrating an exemplary embodiment of a detection unit that may be included in the digital PFD of FIG. 1. The detection unit 110 may include a third flip-flop 112 and a fourth flip-flop 114.

The third flip-flop 112 may generate the reference edge signal RES based upon the reference signal FREF and the reset signal RST. The reference edge signal RES may be activated in response to one of the rising edge and the falling edge of the reference signal FREF, and may be deactivated in response to the reset signal RST. The fourth flip-flop 114 may generate the feedback edge signal FES based upon the feedback input signal FFEEDI and the reset signal RST. The feedback edge signal FES may be activated in response to one of the rising edge and the falling edge of the feedback input signal FFEEDI, and may be deactivated in response to the reset signal RST. The third and fourth flip-flops 112, 114 may be D flip-flops, respectively.

The third flip-flop 112 may include a data input terminal, and the fourth flip-flop 114 may include a data input terminal. In an exemplary embodiment, both the data input terminal of the third flip-flop 112 and the data input terminal of the fourth flip-flop 114 may receive a power supply voltage. In another exemplary embodiment, both the data input terminal of the third flip-flop 112 and the data input terminal of the fourth flip-flop 114 may receive a ground voltage.

The third flip-flop 112 may include a clock input terminal receiving the reference signal FREF, a reset input terminal receiving the reset signal RST, and an output terminal outputting the reference edge signal RES. The fourth flip-flop 114 may include a clock input terminal receiving the feedback input signal FFEEDI, a reset input terminal receiving the reset signal RST, and an output terminal outputting the feedback edge signal FES.

Although not illustrated in FIG. 3, the third flip-flop 112 may further include an inversion output terminal outputting an inversion signal of the reference edge signal RES, and the fourth flip-flop 114 may further include an inversion output terminal outputting an inversion signal of the feedback edge signal FES.

Figure 4:
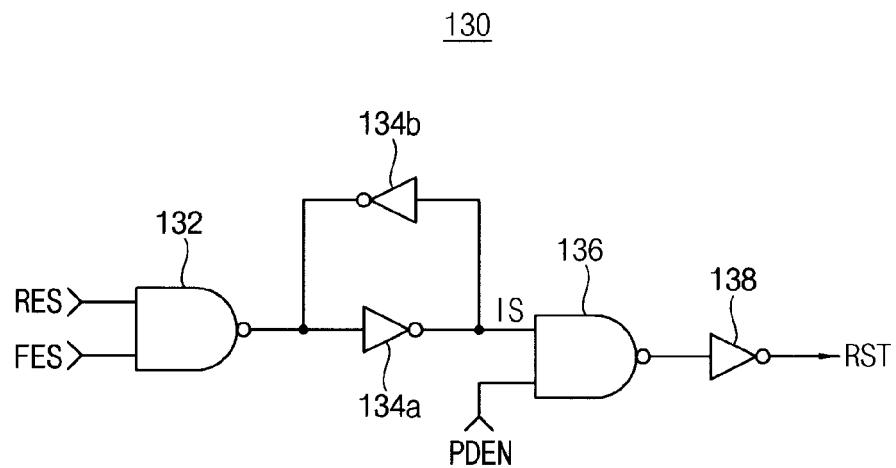
FIG. 4 is a block diagram illustrating an example of a reset unit included in the digital PFD of FIG. 1.

FIG. 4 is a block diagram illustrating an example of a reset unit included in the digital PFD of FIG. 1. The reset unit 130 may include at least one logic element performing a logic operation on the reference edge signal RES, the feedback edge signal FES and the detection enable signal PDEN to generate the reset signal RST. For example, the reset unit 130 may include NAND gates 132, 136, and inverters 134a, 134b, 138.

A first NAND gate 132 may perform the NAND operation on the reference edge signal RES and the feedback edge signal FES. First and second inverters 134a, 134b may have inputs and outputs that are cross-coupled, and may generate an internal signal IS based upon an output signal of the first NAND gate 132. A second NAND gate 136 may perform the NAND operation on the internal signal IS and the detection enable signal PDEN. A third inverter 138 may invert an output signal of the second NAND gate 136 to generate the reset signal RST.

Figure 5:
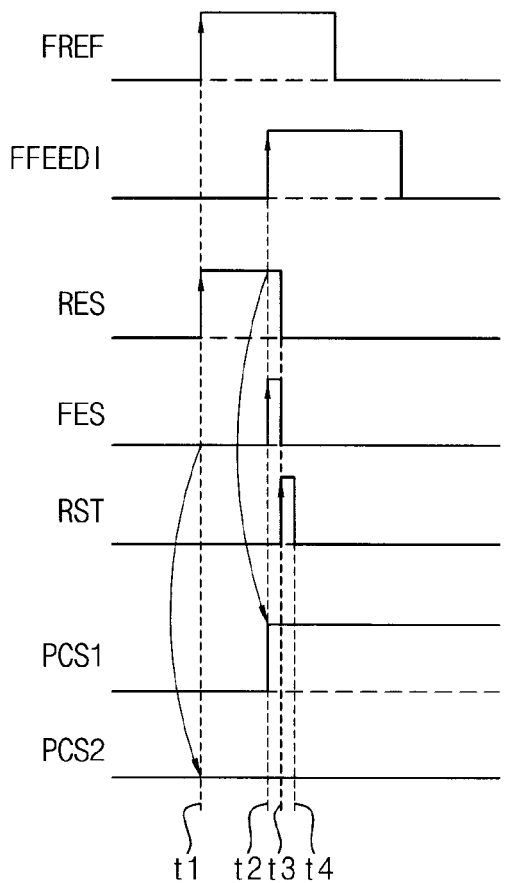
FIGS. 5 and 6 are diagrams for describing the operation of the digital PFD of FIG. 1.
Figure 6:
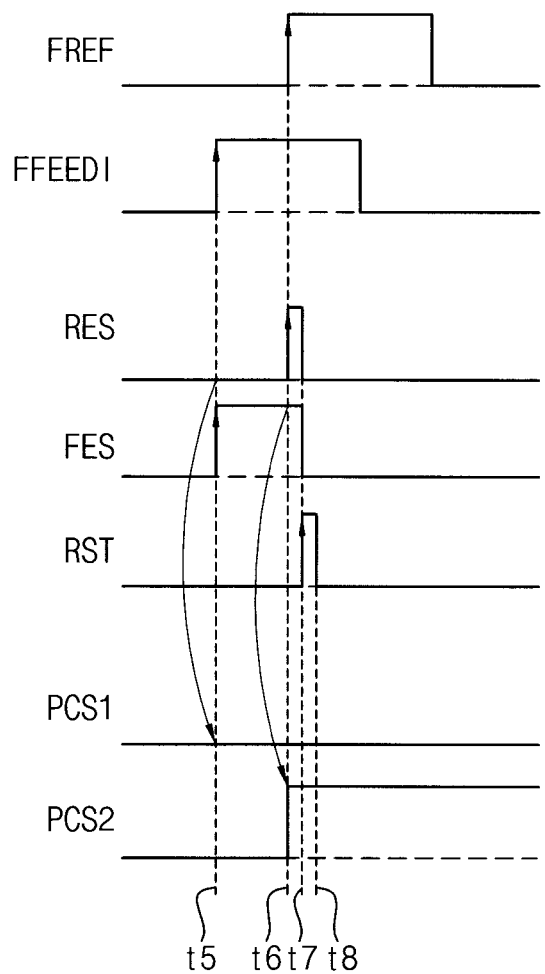

FIGS. 5 and 6 are diagrams for describing the operations of the digital PFD of FIG. 1.

FIG. 5 is a timing diagram illustrating the operation of the digital PFD 100 when the phase of the feedback input signal FFEEDI lags the phase of the reference signal FREF. FIG. 6 is a timing diagram illustrating the operation of the digital PFD 100 when the phase of the feedback input signal FFEEDI leads the phase of the reference signal FREF. In FIGS. 5 and 6, the digital PFD 100 operates in response to rising edges of the signals FREF, FFEEDI, RES, FES, RST, and the signals RES, FES, RST, PCS1, PCS2 are activated by transitioning from the logic low level to the logic high level. The first and second comparison signals CS1, CS2 are not illustrated in FIGS. 5 and 6 because the first and second phase comparison signals PCS1, PCS2 are substantially the same as the first and second comparison signals CS1, CS2.

Hereinafter, the operations of the digital PFD 100 will be described in detail with reference to FIGS. 1, 5 and 6.

Referring to FIGS. 1 and 5, at time t1, the reference signal FREF is transitioned from the logic low level to the logic high level. The reference edge signal RES is activated by the detection unit 110 in response to a rising edge of the reference signal FREF. At time t2, the feedback input signal FFEEDI is transitioned from the logic low level to the logic high level. The feedback edge signal FES is activated by the detection unit 110 in response to a rising edge of the feedback input signal FFEEDI.

At time t1, the logic level of the second phase comparison signal PCS2 is determined by the phase comparison unit 120 in response to a rising edge of the reference edge signal RES and the logic level of the feedback edge signal FES. The feedback edge signal FES has the logic low level at time t1, and thus the second phase comparison signal PCS2 is maintained at the logic low level. At time t2, the logic level of the first phase comparison signal PCS1 is determined by the phase comparison unit 120 in response to a rising edge of the feedback edge signal FES and the logic level of the reference edge signal RES. The reference edge signal RES has the logic high level at time t2, and thus the first phase comparison signal PCS1 is transitioned from the logic low level to the logic high level. The first phase comparison signal PCS1 is activated, the second phase comparison signal PCS2 is deactivated, and thus the phase comparison signals PCS1, PCS2 indicate that the phase of the feedback input signal FFEEDI lags the phase of the reference signal FREF.

The reset signal RST is asynchronously activated in response to the reference edge signal RES and the feedback edge signal FES. For example, both the reference edge signal RES and the feedback edge signal FES have the logic high level at time t2, and the reset signal RST is activated by the reset unit 130 at time t3 in response to the activated edge signals RES, FES after a predetermined delay time interval is elapsed from time t2. Both the reference edge signal RES and the feedback edge signal FES are deactivated by the detection unit 110 at time t3 in response to the activated reset signal RST. The reset signal RST is deactivated by the reset unit 130 at time t4 in response to the deactivated edge signals RES, FES after the predetermined delay time interval is elapsed from time t3.

Referring to FIGS. 1 and 6, at time t5, the feedback input signal FFEEDI is transitioned from the logic low level to the logic high level. The feedback edge signal FES is activated by the detection unit 110 in response to a rising edge of the feedback input signal FFEEDI. At time t6, the reference signal FREF is transitioned from the logic low level to the logic high level. The reference edge signal RES is activated by the detection unit 110 in response to a rising edge of the reference signal FREF.

At time t5, the logic level of the first phase comparison signal PCS1 is determined by the phase comparison unit 120 in response to a rising edge of the feedback edge signal FES and the logic level of the reference edge signal RES. The reference edge signal RES has the logic low level at time t5, and thus the first phase comparison signal PCS1 is maintained at the logic low level. At time t6, the logic level of the second phase comparison signal PCS2 is determined by the phase comparison unit 120 in response to a rising edge of the reference edge signal RES and the logic level of the feedback edge signal FES. The feedback edge signal FES has the logic high level at time t6, and thus the second phase comparison signal PCS2 is transitioned from the logic low level to the logic high level. The first phase comparison signal PCS1 is deactivated, the second phase comparison signal PCS2 is activated, and thus the phase comparison signals PCS1, PCS2 indicate that the phase of the feedback input signal FFEEDI leads the phase of the reference signal FREF.

Both the reference edge signal RES and the feedback edge signal FES have the logic high level at time t6, and the reset signal RST is activated by the reset unit 130 at time t7 in response to the activated edge signals RES, FES after the predetermined delay time interval is elapsed from time t6. Both the reference edge signal RES and the feedback edge signal FES are deactivated by the detection unit 110 at time t7 in response to the activated reset signal RST. The reset signal RST is deactivated by the reset unit 130 at time t8 in response to the deactivated edge signals RES, FES after the predetermined delay time interval is elapsed from time t7.

Figure 7:
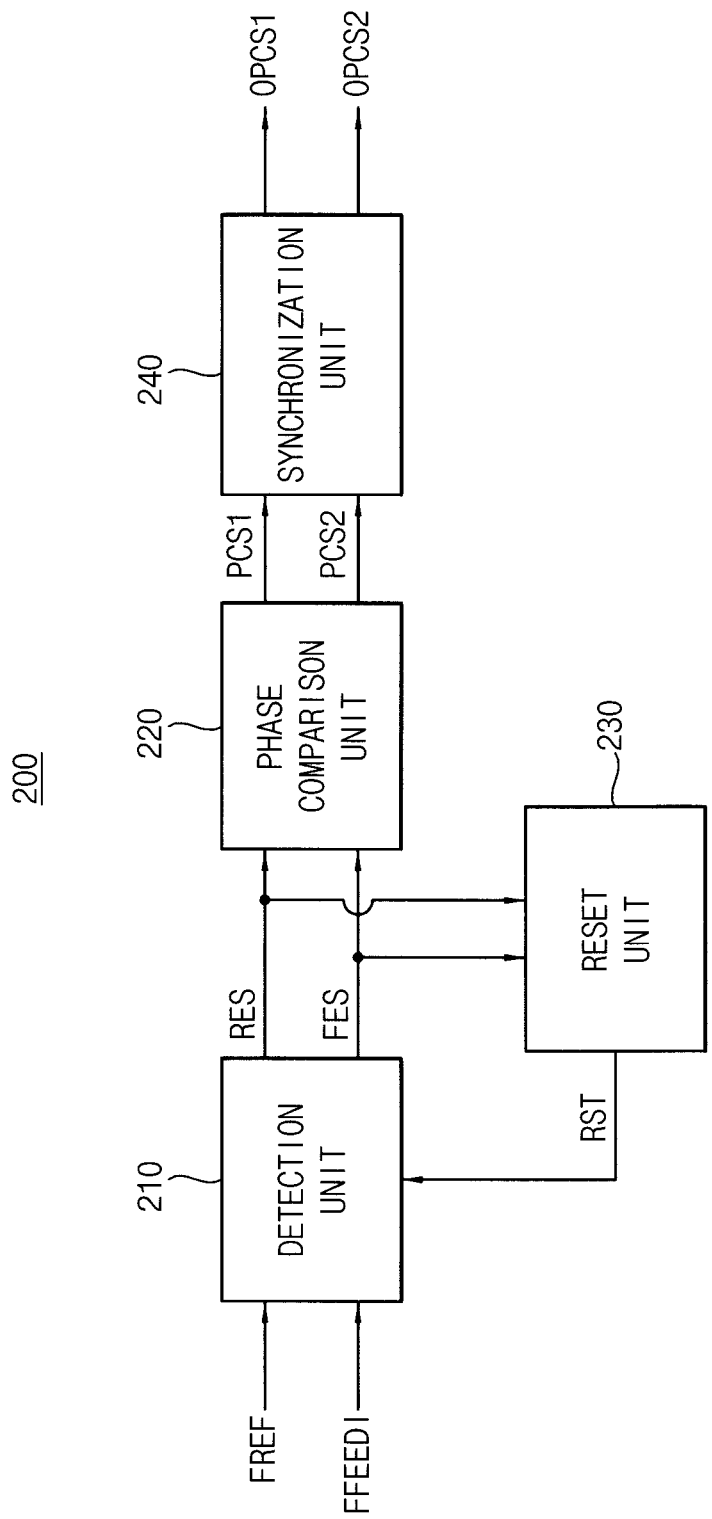
FIG. 7 is a block diagram illustrating a digital PFD according to an exemplary embodiment.

FIG. 7 is a block diagram illustrating a digital PFD according to an exemplary embodiment. A digital PFD 200 includes a detection unit 210, a phase comparison unit 220 and a reset unit 230, and may further include a synchronization unit 240.

In comparison to the digital PFD 100 of FIG. 1, the digital PFD 200 further includes the synchronization unit 240. The detection unit 210, the phase comparison unit 220 and the reset unit 230 in FIG. 7 may be substantially the same as the detection unit 110, the phase comparison unit 120 and the reset unit 130 in FIG. 1, respectively, and thus further explanation will not be repeated.

The synchronization unit 240 may synchronize the first phase comparison signal PCS1 and the second phase comparison signal PCS2 with one of the reference signal FREF and the feedback input signal FFEEDI to generate a first phase comparison output signal OPCS1 and a second phase comparison output signal OPCS2. The first phase comparison output signal OPCS1 may correspond to the first phase comparison signal PCS1, and the second phase comparison output signal OPCS2 may correspond to the second phase comparison signal PCS2.

As described above with reference to FIGS. 5 and 6, a timing point at which the logic level of the first phase comparison signal PCS1 is determined may be different from a timing point at which the logic level of the second phase comparison signal PCS2 is determined. In other words, the first and second phase comparison signals PCS1, PCS2 may be not synchronized with each other. The digital PFD 200 according to other exemplary embodiments may generate the first and second phase comparison output signals OPCS1, OPCS2 that indicate the phase difference and the frequency difference between of the feedback input signal FFEEDI and the reference signal FREF. The first and second phase comparison output signals OPCS1, OPCS2 may be synchronized with the edge of the reference signal FREF or the edge of the feedback input signal FFEEDI. Thus, the digital PFD 200 may have relatively high operational reliability and high operational stability.

Figure 8:
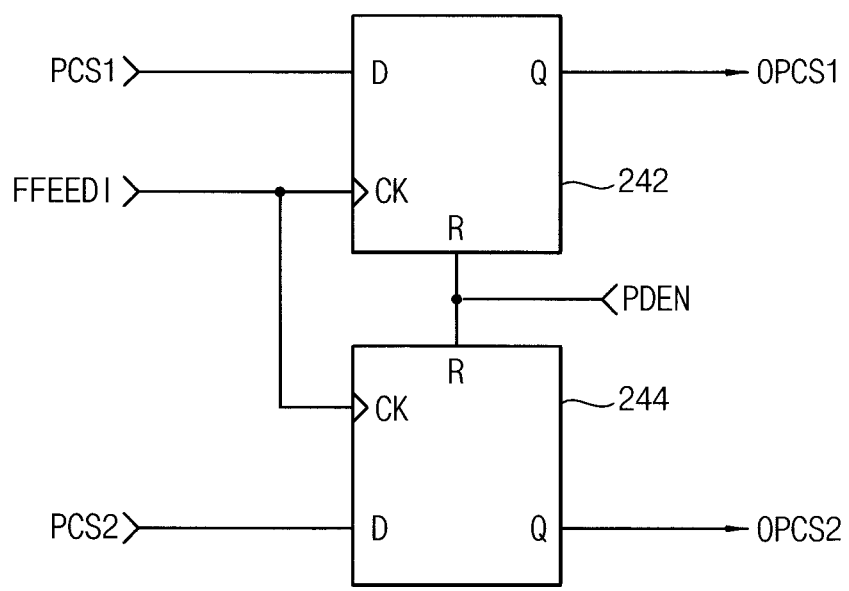
FIG. 8 is a block diagram illustrating an example of a synchronization unit included in the digital PFD of FIG. 7.

FIG. 8 is a block diagram illustrating an example of a synchronization unit included in the digital PFD of FIG. 7. The synchronization unit 240 may include a fifth flip-flop 242 and a sixth flip-flop 244.

The fifth flip-flop 242 may have a data input terminal receiving the first phase comparison signal PCS1 and a clock input terminal receiving the feedback input signal FFEEDI, and may generate the first phase comparison output signal OPCS1 based upon the first phase comparison signal PCS1 and the feedback input signal FFEEDI. For example, the fifth flip-flop 242 may sample the first phase comparison signal PCS1 based upon the feedback input signal FFEEDI to generate the first phase comparison output signal OPCS1.

The sixth flip-flop 244 may have a data input terminal receiving the second phase comparison signal PCS2 and a clock input terminal receiving the feedback input signal FFEEDI, and may generate the second phase comparison output signal OPCS2 based upon the second phase comparison signal PCS2 and the feedback input signal FFEEDI. For example, the sixth flip-flop 244 may sample the second phase comparison signal PCS2 based upon the feedback input signal FFEEDI to generate the second phase comparison output signal OPCS2.

The fifth and sixth flip-flops 242, 244 may be D flip-flops, respectively. The fifth flip-flop 242 may include a reset input terminal receiving the detection enable signal PDEN and an output terminal outputting the first phase comparison output signal OPCS1. The sixth flip-flop 244 may include a reset input terminal receiving the detection enable signal PDEN and an output terminal outputting the second phase comparison output signal OPCS2. The first and second phase comparison output signals OPCS1, OPCS2 may be synchronized with a rising edge or a falling edge of the feedback input signal FFEEDI.

Although the synchronization unit 240 performing the synchronization operation based upon the feedback input signal FFEEDI is illustrated in FIG. 8, the synchronization unit may perform the synchronization operation based upon the reference signal FREF. For example, the clock input terminals of the fifth and sixth flip-flops in the synchronization unit may receive the reference signal FREF instead of the feedback input signal FFEEDI, and thus the first and second phase comparison output signals OPCS1, OPCS2 may be synchronized with a rising edge or a falling edge of the reference signal FREF.

Figure 9:
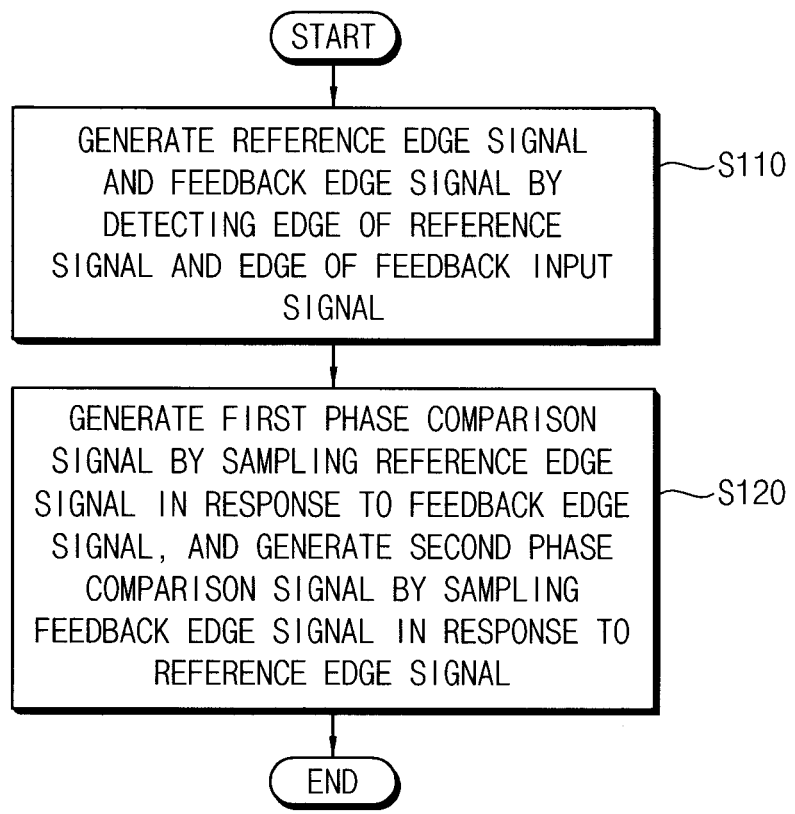
FIG. 9 is a flow chart illustrating a method of detecting the phase and frequency of an output signal according to an exemplary embodiment.

FIG. 9 is a flow chart illustrating a method of detecting a phase and a frequency of an output signal according to some exemplary embodiments.

Referring to FIGS. 1, 7 and 9, in a method according to an exemplary embodiment, a reference edge signal RES and a feedback edge signal FES are generated by detecting an edge of a reference signal FREF and an edge of a feedback input signal FFEEDI (step S110). For example, the reference edge signal RES may be generated by detecting a rising edge or a falling edge of the reference signal FREF, and the feedback edge signal FES may be generated by detecting a rising edge or a falling edge of the feedback input signal FFEEDI. The reference signal FREF may correspond to an input signal, and the feedback input signal FFEEDI may correspond to the output signal.

A first phase comparison signal PCS1 is generated by sampling the reference edge signal RES in response to the feedback edge signal FES, and a second phase comparison signal PCS2 is generated by sampling the feedback edge signal FES in response to the reference edge signal RES (step S120). The first and second phase comparison signals PCS1, PCS2 indicate whether a phase of the feedback input signal FFEEDI leads or lags a phase of the reference signal FREF. The first and second phase comparison signals PCS1, PCS2 are generated by using two flip-flops (e.g., flip-flops 122, 124 in FIG. 2), and indicate whether a phase of the feedback input signal FFEEDI leads or lags a phase of the reference signal FREF. A logic level of the first phase comparison signal PCS1 may complement a logic level of the second phase comparison signal PCS2.

In an exemplary embodiment, a reset signal RST for deactivating the reference edge signal RES and the feedback edge signal FES may be further generated based upon the reference edge signal RES and the feedback edge signal FES. In another exemplary embodiment, a first phase comparison output signal OPCS1 and a second phase comparison output signal OPCS2 may be further generated by synchronizing the first phase comparison signal PCS1 and the second phase comparison signal PCS2 with one of the reference signal FREF and the feedback input signal FFEEDI.

In the method of detecting the phase and the frequency of the output signal according to an exemplary embodiment, the first and second phase comparison signals PCS1, PCS2 are generated by sampling the reference edge signal RES in response to the feedback edge signal FES and sampling the feedback edge signal FES in response to the reference edge signal RES (i.e., by performing an inter-synchronization operation), and by using only two flip-flops. Thus, a digital PFD (e.g., the digital PFD 100 of FIG. 1 or the digital PFD 200 of FIG. 7) operating in accordance with the exemplary method of FIG. 9 may have a relatively simple structure, a high operating speed and effective performance.

Figure 10:
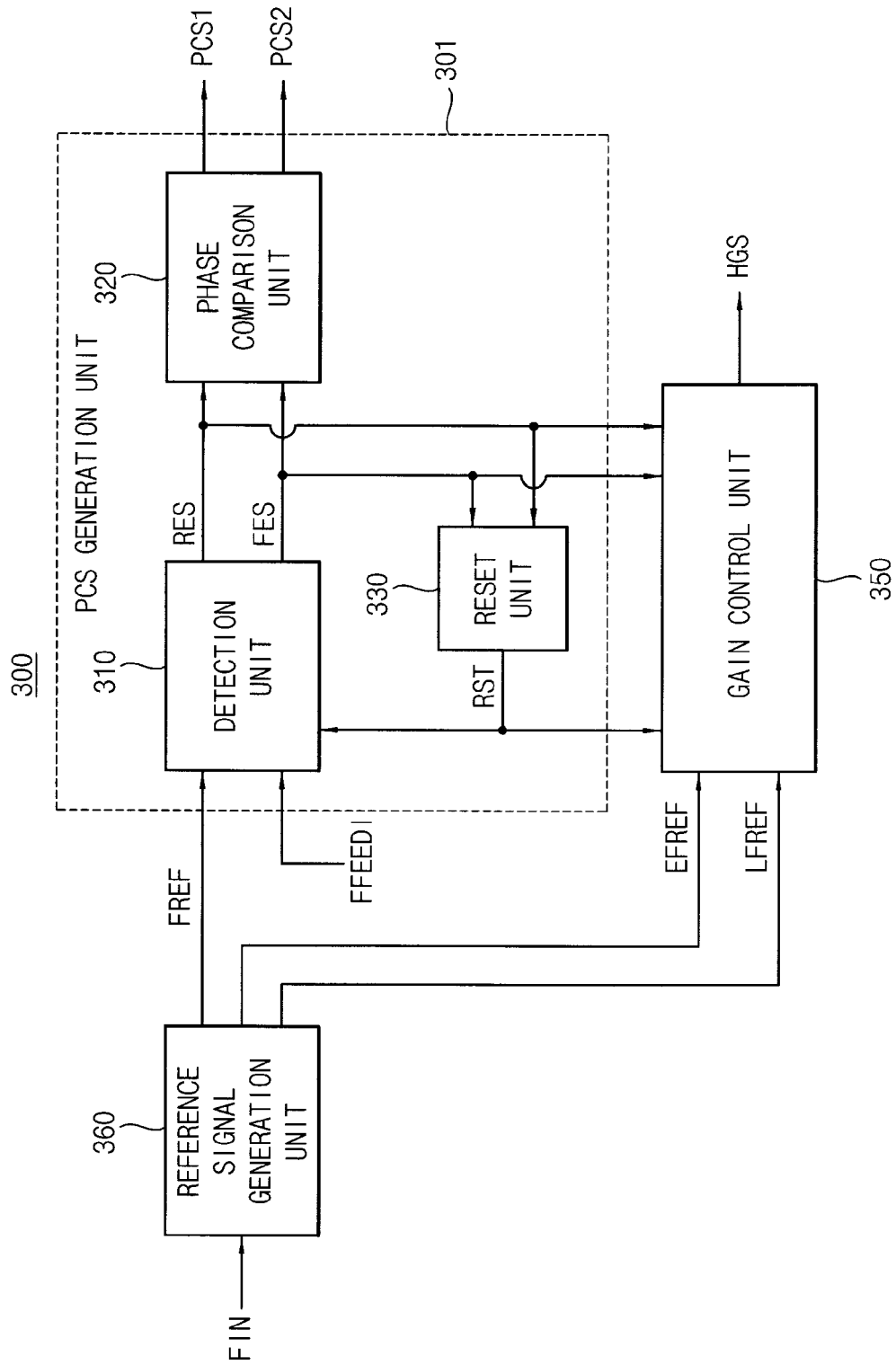
FIG. 10 is a block diagram illustrating a digital PFD according to an exemplary embodiment.

FIG. 10 is a block diagram illustrating a digital PFD according to an exemplary embodiment. A digital PFD 300 includes a reference signal generation unit 360, a phase comparison signal generation unit 301 and a gain control unit 350.

The reference signal generation unit 360 generates a lead reference signal EFREF, a reference signal FREF and a lag reference signal LFREF based upon an input signal FIN.

Figure 11:
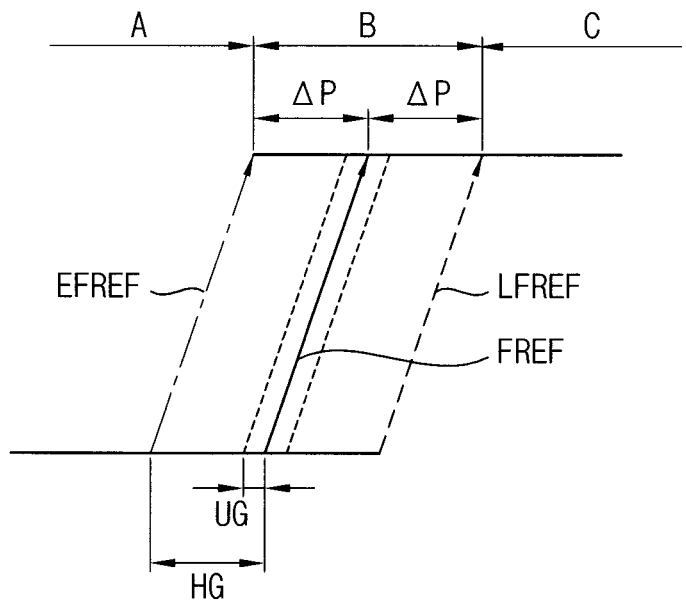
FIG. 11 is a diagram for describing the operation of a reference signal generation unit included in the digital PFD of FIG. 10.

FIG. 11 is a diagram for describing the operation of the reference signal generation unit included in the digital PFD of FIG. 10.

Referring to FIG. 11, the reference signal generation unit 360 may generate the reference signals EFREF, FREF, LFREF by delaying the input signal FIN. A waveform of the lead reference signal EFREF and a waveform of the lag reference signal LFREF may be substantially the same as a waveform of the reference signal FREF. A phase of the lead reference signal EFREF may lead a phase of the reference signal FREF by about ΔP, and a phase of the lag reference signal LFREF may lag the phase of the reference signal FREF by about ΔP. For example, a value of ΔP may be in a range of about 0 degree to about 180 degrees.

In FIG. 11, reference numeral UG indicates an unit gain, and reference numeral HG indicates an adjusted gain that is greater than the unit gain UG. As described below with reference to FIG. 28, a digital PLL including the digital PFD 300 may shift a phase of a feedback input signal FFEEDI corresponding to an output signal of the digital PLL to compensate a phase difference and a frequency difference between the reference signal FREF and the output signal. The phase of the feedback input signal FFEEDI may be shifted by the unit gain UG or by the adjusted gain HG depending on a phase difference between the reference signal FREF and the feedback input signal FFEEDI. For example, if the phase difference between the reference signal FREF and the feedback input signal FFEEDI is smaller than the predetermined phase difference ΔP, in other words, if an edge (e.g., a rising edge) of the feedback input signal FFEEDI is within a time interval B, the phase of the feedback input signal FFEEDI may be shifted by the unit gain UG. If the phase difference between the reference signal FREF and the feedback input signal FFEEDI is greater than the predetermined phase difference ΔP, in other words, if the edge (e.g., the rising edge) of the feedback input signal FFEEDI is within a time interval A or a time interval C outside of time interval B, the phase of the feedback input signal FFEEDI may be shifted by the adjusted gain HG.

Referring back to FIG. 10, the phase comparison signal generation unit 301 generates a reference edge signal RES and a feedback edge signal FES based upon the reference signal FREF and the feedback input signal FFEEDI, and generates a first phase comparison signal PCS1 and a second phase comparison signal PCS2 based upon the reference edge signal RES and the feedback edge signal FES. The first and second phase comparison signals PCS1, PCS2 indicate whether the phase of the feedback input signal FFEEDI leads or lags the phase of the reference signal FREF. The reference edge signal RES may be activated in response to the edge of the reference signal FREF, and the feedback edge signal FES may be activated in response to the feedback input signal FFEEDI. The activation of the first and the second phase comparison signals PCS1, PCS2 may complement each other. For example, the first phase comparison signal PCS1 may be activated when the phase of the feedback input signal FFEEDI lags the phase of the reference signal FREF, and the second phase comparison signal PCS2 may be activated when the phase of the feedback input signal FFEEDI leads the phase of the reference signal FREF.

In an exemplary embodiment, the phase comparison signal generation unit 301 may have substantially the same structure as the digital PFD 100 of FIG. 1. The detection unit 310, the phase comparison unit 320 and the reset unit 330 in FIG. 10 may be substantially the same as the detection unit 110, the phase comparison unit 120 and the reset unit 130 in FIG. 1, respectively, and thus further explanation will not be repeated. Although not illustrated in FIG. 10, the phase comparison signal generation unit 301 may further include a synchronization unit that is substantially the same as the synchronization unit 240 in FIG. 7, according to some exemplary embodiments. In another exemplary embodiment, the phase comparison signal generation unit 301 may be similar to a normal digital PFD.

The gain control unit 350 generates a high gain signal HGS based upon the lead reference signal EFREF, the lag reference signal LFREF, the reference edge signal RES and the feedback edge signal FES. The high gain signal HGS indicates whether the phase difference between the reference signal FREF and the feedback input signal FFEEDI is greater than the predetermined phase difference (e.g., ΔP in FIG. 11). In other words, the high gain signal HGS indicates whether the feedback input signal FFEEDI is compensated by using the unit gain UG or the adjusted gain HG.

In an exemplary embodiment, the high gain signal HGS may be activated when the phase difference between the reference signal FREF and the feedback input signal FFEEDI is greater than the predetermined phase difference. For example, the high gain signal may be activated when the phase of the feedback input signal FFEEDI leads the phase of the lead reference signal EFREF (i.e., when the edge of the feedback input signal FFEEDI is within the time interval A in FIG. 11), or the phase of the feedback input signal FFEEDI lags the phase of the lag reference signal LFREF (i.e., when the edge of the feedback input signal FFEEDI is within the time interval C in FIG. 11).

In an exemplary embodiment, the phase comparison signal generation unit 301 may generate a reset signal RST based upon the reference edge signal RES and the feedback edge signal FES. The gain control unit 350 may generate the high gain signal HGS further based upon the reset signal RST.

In an exemplary embodiment, the lead reference signal EFREF may include a plurality of first reference signals such that a phase of each first reference signal leads the phase of the reference signal FREF. For example, a phase of a first of the first reference signals may lead the phase of the reference signal FREF by a predetermined phase, and a phase of a second of the first reference signals may lead the phase of the first of the first reference signals by the predetermined phase. Similarly, the lag reference signal LFREF may include a plurality of second reference signals such that a phase of each second reference signal lags the phase of the reference signal FREF. As described below with reference to FIGS. 19, 20 and 21, the gain control unit 350 may generate a plurality of high gain signals based upon the plurality of the first and second reference signals such that the plurality of high gain signals precisely indicates whether the phase of the feedback input signal FFEEDI leads or lags the phase of the reference signal FREF.

In a conventional digital PFD included in a conventional digital PLL, a feedback input signal is compensated by using a fixed feedback gain. The time required to compensate the feedback input signal in the conventional digital PFD may be relatively long if a phase of the feedback input signal excessively leads or lags a phase of the reference signal. Thus, the time required to lock a phase and a frequency of an output signal of the conventional digital PLL may be relatively long.

The digital PFD 300 according to other exemplary embodiments further generates the high gain signal HGS based upon the lead reference signal EFREF, the lag reference signal LFREF, the reference edge signal RES and the feedback edge signal FES, and the feedback gain used to compensate the feedback input signal FFEEDI may be adjusted depending on the high gain signal HGS. For example, the feedback input signal FFEEDI may be compensated by using the unit gain UG when the high gain signal HGS is deactivated, and may be compensated by using the adjusted gain HG when the high gain signal HGS is activated such that the adjusted gain HG is greater than the unit gain UG. Thus, the digital PFD 300 may compensate the feedback input signal FFEEDI with a relatively reduced compensation time, and a digital PLL including the digital PFD 300 may lock a phase and a frequency of an output signal with a relatively reduced lock time.

In addition, the gain control unit 350 included in the digital PFD 300 may disabled after such locking operation of the digital PLL is finished, which is in a so-called "steady state". Thus, the time required to lock the phase and the frequency of the output signal of the digital PLL including the digital PFD 300 may be effectively reduced without increasing jitter noise and/or phase noise.

Figure 12:
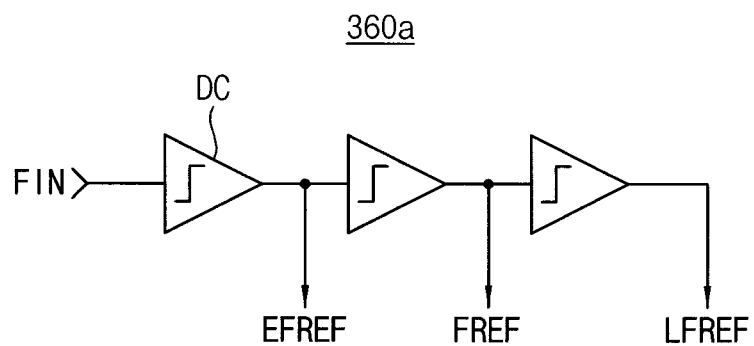
FIG. 12 is a block diagram illustrating an example of the reference signal generation unit included in the digital PFD of FIG. 10.

FIG. 12 is a block diagram illustrating an example of the reference signal generation unit included in the digital PFD of FIG. 10. A reference signal generation unit 360*a* may include three delay cells DC that are cascaded-coupled, and may sequentially generate the lead reference signal EFREF, the reference signal FREF and the lag reference signal LFREF by delaying the input signal FIN, the lead reference signal EFREF and the reference signal FREF, respectively. For example, a first delay cell may delay the input signal FIN by a predetermined phase (e.g., ΔP) to generate the lead reference signal EFREF, a second delay cell may delay the lead reference signal EFREF by the predetermined phase to generate the reference signal FREF, and a third delay cell may delay the reference signal FREF by the predetermined phase to generate the lag reference signal LFREF.

Although not illustrated in FIG. 12, the reference signal generation unit may include two delay cells. For example, the reference signal generation unit may output the input signal FIN as the lead reference signal EFREF, may generate the reference signal FREF by delaying the lead reference signal EFREF, and may generate the lag reference signal LFREF by delaying the reference signal FREF.

Figure 13:
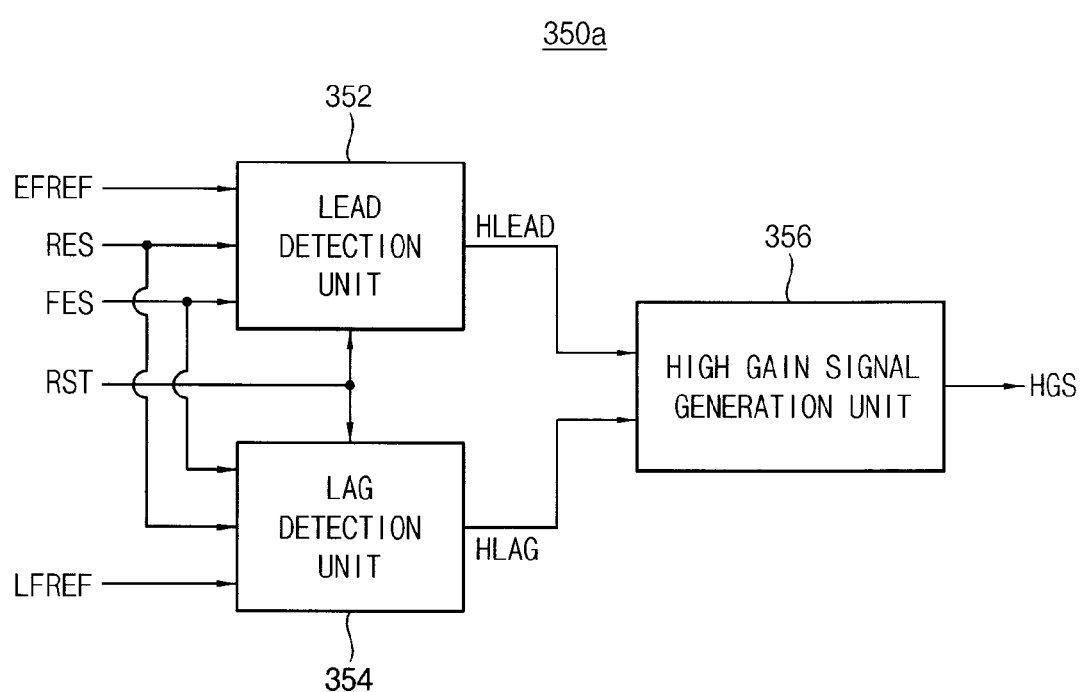
FIG. 13 is a block diagram illustrating an example of a gain control unit included in the digital PFD of FIG. 10.

FIG. 13 is a block diagram illustrating an example of a gain control unit included in the digital PFD of FIG. 10. A gain control unit 350*a* may include a lead detection unit 352, a lag detection unit 354 and a high gain signal generation unit 356.

The lead detection unit 352 may generate a high lead signal HLEAD based upon the lead reference signal EFREF, the reference edge signal RES and the feedback edge signal FES. The high lead signal HLEAD may indicate whether the phase of the feedback input signal FFEEDI leads the phase of the lead reference signal EFREF. The high lead signal HLEAD may be activated when the phase of the feedback input signal FFEEDI leads the phase of the lead reference signal EFREF.

The lag detection unit 354 may generate a high lag signal HLAG based upon the lag reference signal LFREF, the reference edge signal RES and the feedback edge signal FES. The high lag signal HLAG may indicate whether the phase of the feedback input signal FFEEDI lags the phase of the lag reference signal LFREF. The high lag signal HLAG may be activated when the phase of the feedback input signal FFEEDI lags the phase of the lag reference signal LFREF. The lead detection unit 352 and the lag detection unit 354 may further receive the reset signal RST.

The high gain signal generation unit 356 may generate the high gain signal HGS based upon the high lead signal HLEAD and the high lag signal HLAG. In an exemplary embodiment, the high gain signal generation unit 356 may include at least one logic element that performs a logic operation on the high lead signal HLEAD and the high lag signal HLAG.

Figure 14:
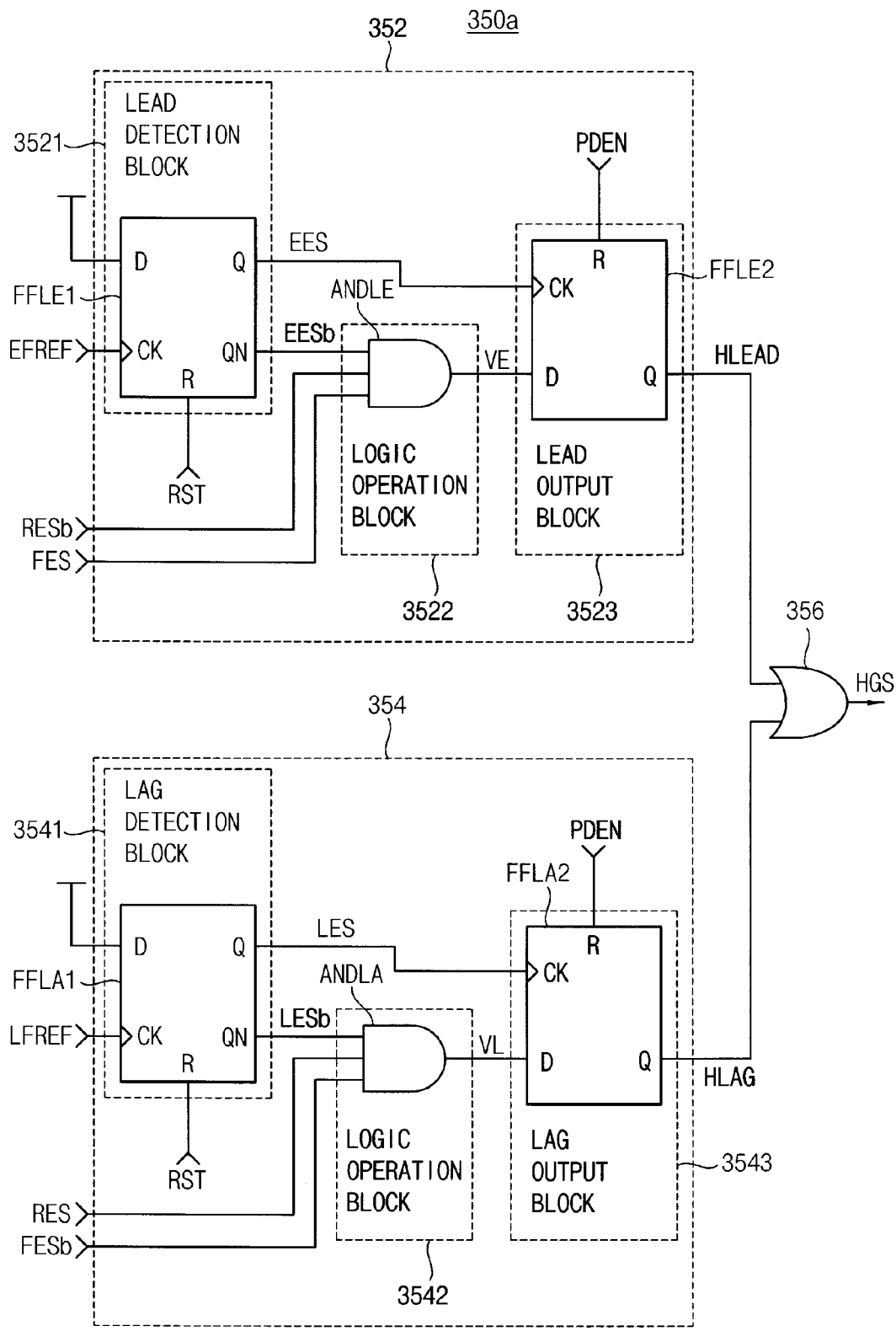
FIG. 14 is a block diagram illustrating a detailed example of the gain control unit of FIG. 13.

FIG. 14 is a block diagram illustrating a detailed example of the gain control unit of FIG. 13. The gain control unit 350a may include the lead detection unit 352, the lag detection unit 354 and the high gain signal generation unit 356. The lead detection unit 352 may include a lead detection block 3521, a logic operation block 3522 and a lead output block 3523.

The lead detection block 3521 may detect an edge of the lead reference signal EFREF to generate a lead edge signal EES. The lead edge signal EES may be activated in response to a rising edge or a falling edge of the lead reference signal EFREF, and may be deactivated in response to the reset signal RST. The lead detection block 3521 may include a first flip-flop FFLE1. The first flip-flop FFLE1 may have a data input terminal receiving a power supply voltage, a clock input terminal receiving the lead reference signal EFREF, a reset input terminal receiving the reset signal RST, an output terminal outputting the lead edge signal EES and an inversion output signal outputting an inversion signal EESb of the lead edge signal EES. The first flip-flop FFLE1 may be a D flip-flop.

The logic operation block 3522 may perform a logic operation on the lead edge signal EESb, the reference edge signal RESb and the feedback edge signal FES to generate a lead signal VE. In an exemplary embodiment, the logic operation block 3522 may include an AND gate ANDLE. The AND gate ANDLE may perform an AND operation on the inversion signal EESb of the lead edge signal EES, an inversion signal RESb of the reference edge signal RES and the feedback edge signal FES to generate the lead signal VE. In this case, the lead signal VE may be activated when the feedback edge signal FES is activated and the lead edge signal EES and the reference edge signal RES are deactivated. The inversion signal RESb of the reference edge signal RES may be provided from an inversion output terminal (not illustrated) of the third flip-flop 112 in the detection unit 110 of FIG. 3, or may be provided by inverting the reference edge signal RES from the output terminal of the third flip-flops 112.

The lead output block 3523 may synchronize the lead signal VE with the lead edge signal EES to generate the high lead signal HLEAD. For example, the lead output block 3523 may sample a logic level of the lead signal VE based upon the lead edge signal EES to generate the high lead signal HLEAD when the lead edge signal EES is activated, and thus a logic level of the high lead signal HLEAD may correspond to the logic level of the lead signal VE at an activation timing of the lead edge signal EES. The lead output block 3523 may include a second flip-flop FFLE2. The second flip-flop FFLE2 may have a data input terminal receiving the lead signal VE, a clock input terminal receiving the lead edge signal EES, a reset input terminal receiving a detection enable signal PDEN and an output terminal outputting the high lead signal HLEAD. The second flip-flop FFLE2 may be a D flip-flop.

The lag detection unit 354 may include a lag detection block 3541, a logic operation block 3542 and a lag output block 3543. The lag detection unit 354 may have substantially the same structure as the lead detection unit 352.

The lag detection block 3541 may detect an edge of the lag reference signal LFREF to generate a lag edge signal LES. The lag edge signal LES may be activated in response to a rising edge or a falling edge of the lag reference signal LFREF, and may be deactivated in response to the reset signal RST. The lead detection block 3521 may include a third flip-flop FFLA1.

The logic operation block 3542 may perform a logic operation on the lag edge signal LESb, the reference edge signal RES and the feedback edge signal FESb to generate a lag signal VL. In an exemplary embodiment, the logic operation block 3542 may include an AND gate ANDLA. The AND gate ANDLA may perform the AND operation on the inversion signal LESb of the lag edge signal LES, the reference edge signal RES and an inversion signal FESb of the feedback edge signal FES to generate the lag signal VL. In this case, the lag signal VL may be activated when the reference edge signal RES is activated and the lag edge signal LES and the feedback edge signal FES are deactivated. The inversion signal FESb of the feedback edge signal FES may be provided from an inversion output terminal (not illustrated) of the fourth flip-flop 114 in the detection unit 110 of FIG. 3, or may be provided by inverting the feedback edge signal FES from the output terminal of the third flip-flop 112.

The lag output block 3543 may synchronize the lag signal VL with the lag edge signal LES to generate the high lag signal HLAG. For example, the lag output block 3543 may sample a logic level of the lag signal VL based upon the lag edge signal LES to generate the high lag signal HLAG when the lag edge signal LES is activated, and thus a logic level of the high lag signal HLAG may correspond to the logic level of the lag signal VL at an activation timing of the lag edge signal LES. The lag output block 3543 may include a fourth flip-flop FFLA2.

The high gain signal generation unit 356 may be implemented with an OR gate. The OR gate may perform an OR operation on the high lead signal HLEAD and the high lag signal HLAG to generate the high gain signal HGS. The high gain signal HGS may be activated when one of the high lead signal HLEAD and the high lag signal HLAG is activated.

Figure 15:
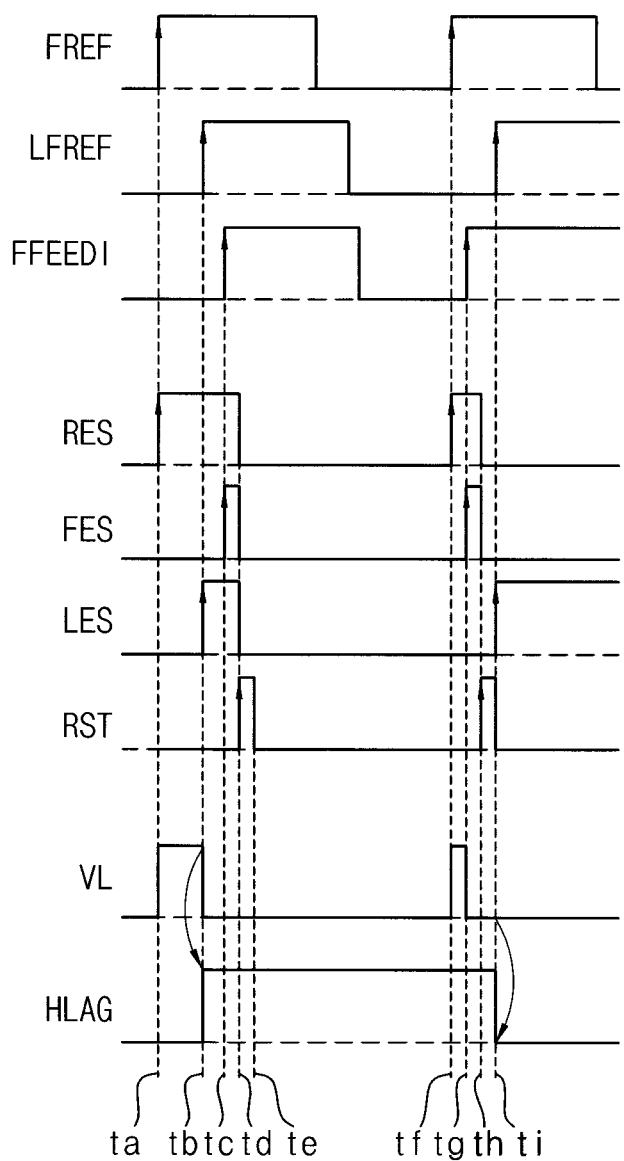
FIGS. 15 and 16 are diagrams for describing the operation of the digital PFD of FIG. 10.
Figure 16:
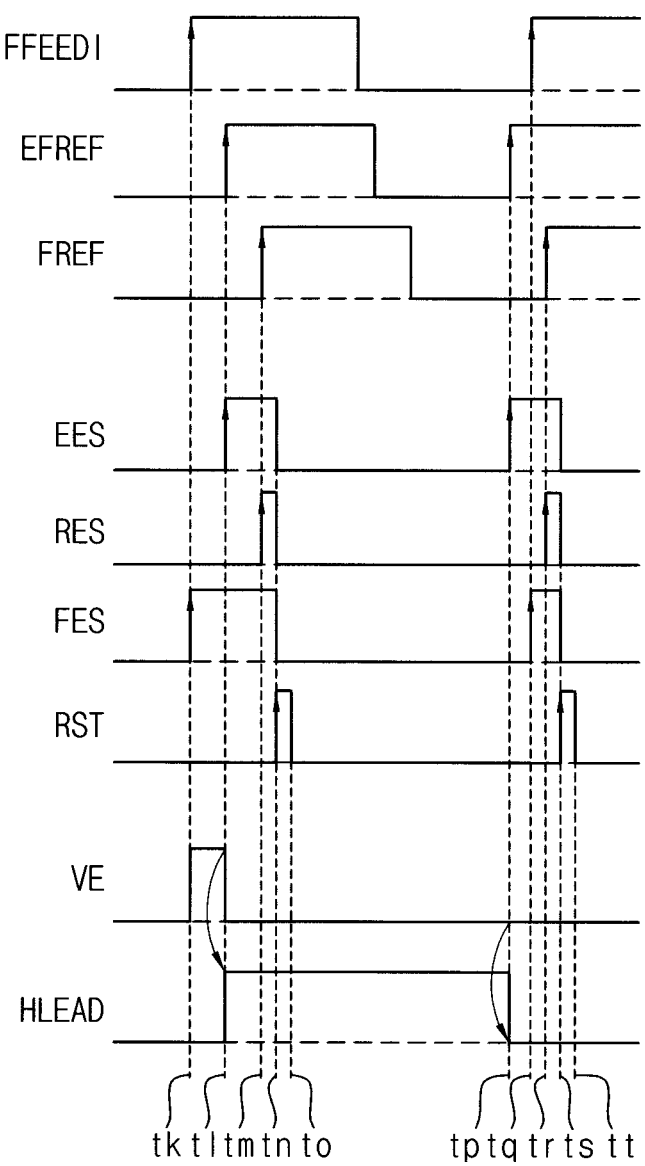

FIGS. 15 and 16 are diagrams for describing the operations of the digital PFD of FIG. 10.

FIG. 15 is a timing diagram illustrating an operation of the digital PFD 300 when the phase of the feedback input signal FFEEDI lags the phase of the reference signal FREF. FIG. 16 is a timing diagram illustrating an operation of the digital PFD 300 when the phase of the feedback input signal FFEEDI leads the phase of the reference signal FREF. In FIGS. 15 and 16, the digital PFD 300 operates in response to rising edges of the signals FREF, LFREF, EFREF, FFEEDI, RES, FES, LES, EES, RST, and the signals RES, FES, LES, EES, RST, VL, VE, HLAG, HLEAD are activated by transitioning from a logic low level to a logic high level.

Hereinafter, the operation of the digital PFD 300 will be described in detail with reference to FIGS. 10, 14, 15 and 16.

Referring to FIGS. 10, 14 and 15, at time ta, the reference signal FREF is transitioned from the logic low level to the logic high level. The reference edge signal RES is activated by the detection unit 310 in response to a rising edge of the reference signal FREF. At time tb, the lag reference signal LFREF is transitioned from the logic low level to the logic high level. The lag edge signal LES is activated by the lag detection block 3541 in response to a rising edge of the lag reference signal LFREF. At time tc, the feedback input signal FFEEDI is transitioned from the logic low level to the logic high level. The feedback edge signal FES is activated by the detection unit 310 in response to a rising edge of the feedback input signal FFEEDI. That is, a first period of the reference signal FREF is started at time ta, a first period of the lag reference signal LFREF is started at time tb, and a first period of the feedback input signal FFEEDI is started at time tc.

At time ta, the reference edge signal RES is activated, the lag edge signal LES and the feedback edge signal FES are deactivated, and the lag signal VL is activated by the logic operation block 3542. At time tb, the lag edge signal LES is activated, and the lag signal VL is deactivated by the logic operation block 3542. In addition, the logic level of the high lag signal HLAG is determined by the lag output block 3543 in response to a rising edge of the lag edge signal LES and the logic level of the lag signal VL. The lag signal VL has the logic high level, and thus the high lag signal HLAG is transitioned from the logic low level to the logic high level. The high lag signal HLAG indicates that the phase of the feedback input signal FFEEDI lags the phase of the lag reference signal LFREF.

The reset signal RST is asynchronously activated in response to the reference edge signal RES and the feedback edge signal FES. For example, both the reference edge signal RES and the feedback edge signal FES have the logic high level at time tc, and the reset signal RST is activated by the reset unit 330 at time td in response to the activated edge signals RES and FES after a predetermined delay time interval is elapsed from time tc. Both the reference edge signal RES and the feedback edge signal FES are deactivated at time td in response to the activated reset signal RST. The lag edge signal LES is deactivated at time td in response to the activated reset signal RST. The reset signal RST is deactivated by the reset unit 330 at time te in response to the deactivated edge signals RES, FES after the predetermined delay time interval is elapsed from time td.

At time tf, the reference edge signal RES is activated. At time tg, the feedback edge signal FES is activated. At time ti, the lag edge signal LES is activated. That is, a second period of the reference signal FREF is started at time tf, a second period of the feedback input signal FFEEDI is started at time tg, and a second period of the lag reference signal LFREF is started at time ti. During the first periods of the signals FREF, LFREF, FFEEDI, the high gain signal HGS is activated based upon the activated high lag signal HLAG, and as described below with reference to FIGS. 27, 28 and 29, the phase of the feedback input signal FFEEDI is compensated to a large degree based upon the activated high gain signal HGS. Thus, the digital PFD 300 in the second periods may operate differently from the digital PFD 300 in the first periods.

At time tf, the reference edge signal RES is activated, the lag edge signal LES and the feedback edge signal FES are deactivated, and thus the lag signal VL is activated. At time tg, the feedback edge signal FES is activated, and the lag signal VL is deactivated. At time th, the reset signal RST is asynchronously activated in response to the activated edge signals RES, FES after the predetermined delay time interval is elapsed from time tg. Both the reference edge signal RES and the feedback edge signal FES are deactivated in response to the activated reset signal RST. The lag edge signal LES is maintained at the logic low level. At time ti, the reset signal RST is deactivated in response to the deactivated edge signals RES, FES after the predetermined delay time interval is elapsed from time th. In addition, the logic level of the high lag signal HLAG is determined in response to a rising edge of the lag edge signal LES and the logic level of the lag signal VL. The lag signal VL has the logic low level, and thus the high lag signal HLAG is transitioned from the logic high level to the logic low level. The high lag signal HLAG indicates that the phase of the feedback input signal FFEEDI does not lag the phase of the lag reference signal LFREF.

In an exemplary embodiment, when the phase of the feedback input signal FFEEDI lags the phase of the lag reference signal LFREF, the logic levels of the reference edge signal RES, the feedback edge signal FES and the lag edge signal LES may have a predetermined series of combinations. For example, during the first periods in FIG. 15 (e.g., from time ta to time tf), the logic levels of the signals RES, FES, LES may be changed in order of, for example, 000 (e.g., before time ta), 100 (e.g., from time ta to time tb), 101 (e.g., from time tb to time tc), 111 (e.g., from time tc to time td), and 000 (e.g., from time td to time te).

The phase of the feedback input signal FFEEDI lags the phase of the reference signal FREF during both the first and second periods. Thus, although not illustrated in FIG. 15, the first phase comparison signal PCS1 is transitioned from the logic low level to the logic high level at time tc (i.e. at the rising edge of the feedback edge signal FES), and the second phase comparison signal PCS2 is maintained at the logic low level, as described above with reference to FIG. 5.

Referring to FIGS. 10, 14 and 16, at time tk, the feedback input signal FFEEDI is transitioned from the logic low level to the logic high level, and the feedback edge signal FES is activated. At time t1, the lead reference signal EFREF is transitioned from the logic low level to the logic high level, and the lead edge signal EES is activated. At time tm, the reference signal FREF is transitioned from the logic low level to the logic high level, and the reference edge signal RES is activated. That is, a third period of the feedback input signal FFEEDI is started at time tk, a third period of the lead reference signal EFREF is started at time t1, and a third period of the reference signal FREF is started at time tm.

At time tk, the feedback edge signal FES is activated, the lead edge signal EES and the reference edge signal RES are deactivated, and the lead signal VE is activated by the logic operation block 3522. At time t1, the lead edge signal EES is activated, and the lead signal VE is deactivated by the logic operation block 3522. In addition, the logic level of the high lead signal HLEAD is determined by the lead output block 3523 in response to a rising edge of the lead edge signal EES and the logic level of the lead signal VE. The lead signal VE has the logic high level, and thus the high lead signal HLEAD is transitioned from the logic low level to the logic high level. The high lead signal HLEAD indicates that the phase of the feedback input signal FFEEDI leads the phase of the lead reference signal EFREF.

Both the reference edge signal RES and the feedback edge signal FES have the logic high level at time tm, and the reset signal RST is asynchronously activated by the reset unit 330 at time tn in response to the activated edge signals RES, FES after the predetermined delay time interval is elapsed from time tm. Both the reference edge signal RES and the feedback edge signal FES are deactivated at time tn in response to the activated reset signal RST. The lead edge signal EES is deactivated at time tn in response to the activated reset signal RST. The reset signal RST is deactivated by the reset unit 330 at time to in response to the deactivated edge signals RES, FES after the predetermined delay time interval is elapsed from time tn.

At time tp, the lead edge signal EES is activated. At time tq, the feedback edge signal FES is activated. At time tr, the reference edge signal RES is activated. That is, a fourth period of the lead reference signal EFREF is started at time tp, a fourth period of the feedback input signal FFEEDI is started at time tq, and a fourth period of the reference signal FREF is started at time tr. As described above, the phase of the feedback input signal FFEEDI is compensated to a large degree based upon the activated high lead signal HLEAD (i.e., the activated high gain signal HGS), and thus the digital PFD 300 in the fourth periods may operate differently from the digital PFD 300 in the third periods.

At time tp, the logic level of the high lead signal HLEAD is determined in response to a rising edge of the lead edge signal EES and the logic level of the lead signal VE. The lead signal VE has the logic low level, and thus the high lead signal HLEAD is transitioned from the logic high level to the logic low level. The high lead signal HLEAD indicates that the phase of the feedback input signal FFEEDI does not lead the phase of the lead reference signal EFREF. At time ts, the reset signal RST is asynchronously activated in response to the activated edge signals RES, FES after the predetermined delay time interval is elapsed from time tr. The reference edge signal RES, the feedback edge signal FES and the lead edge signal EES are deactivated in response to the activated reset signal RST. At time tt, the reset signal RST is deactivated in response to the deactivated edge signals RES, FES after the predetermined delay time interval is elapsed from time ts.

In an exemplary embodiment, when the phase of the feedback input signal FFEEDI leads the phase of the lead reference signal EFREF, the logic levels of the lead edge signal EES, the reference edge signal RES and the feedback edge signal FES may have a predetermined series of combinations. For example, during the third periods in FIG. 16 (e.g., from time tk to time to), the logic levels of the signals EES, RES, FES may be changed in order of, for example, 000 (e.g., before time tk), 001 (e.g., from time tk to time t1), 101 (e.g., from time t1 to time tm), 111 (e.g., from time tm to time tn), and 000 (e.g., from time tn to time to).

The phase of the feedback input signal FFEEDI leads the phase of the reference signal FREF during both the third and fourth periods. Thus, although not illustrated in FIG. 16, the second phase comparison signal PCS2 is transitioned from the logic low level to the logic high level at time tm (i.e. at the rising edge of the reference edge signal RES), and the first phase comparison signal PCS1 is maintained at the logic low level, as described above with reference to FIG. 6.

Figure 17:
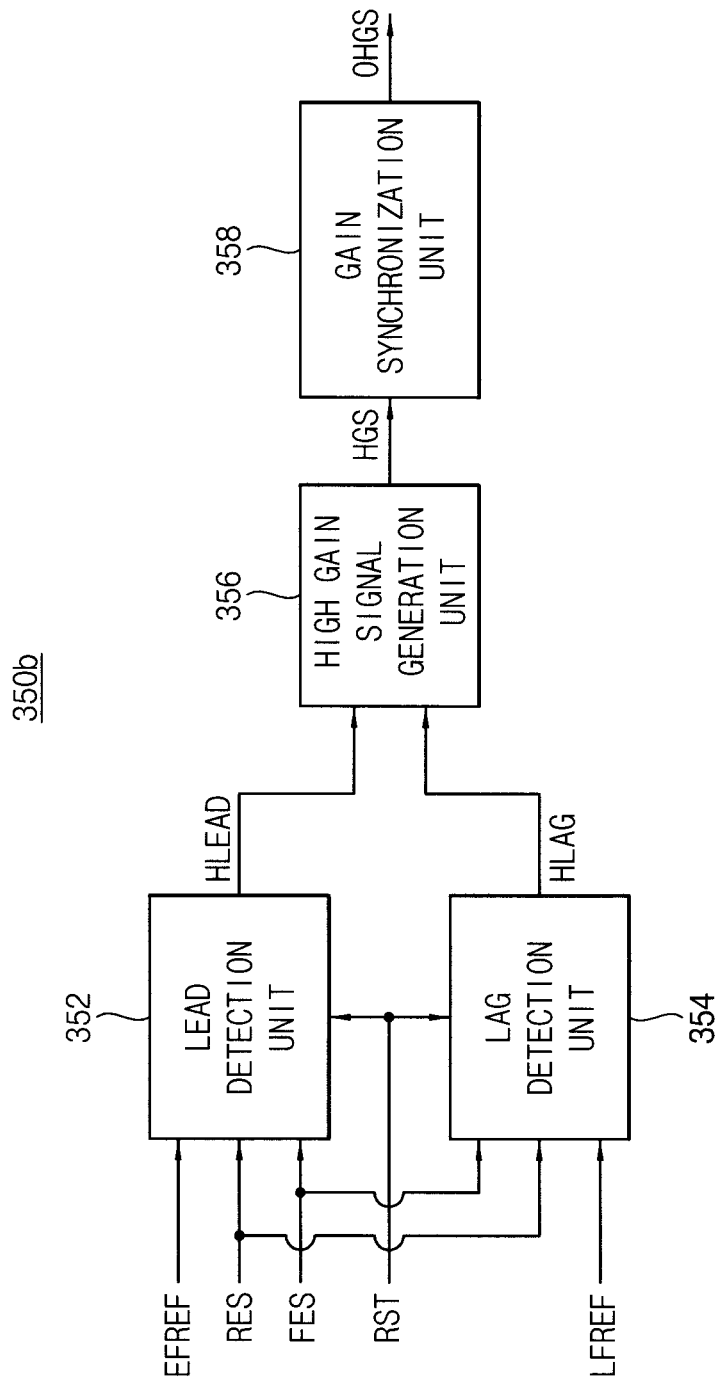
FIG. 17 is a block diagram illustrating an example of the gain control unit included in the digital PFD of FIG. 10.

FIG. 17 is a block diagram illustrating an exemplary embodiment of the gain control unit included in the digital PFD of FIG. 10. A gain control unit 350b may include the lead detection unit 352, the lag detection unit 354 and the high gain signal generation unit 356, and may further include a gain synchronization unit 358.

In comparison to the gain control unit 350a of FIG. 13, the gain control unit 350b may further include the gain synchronization unit 358. The lead detection unit 352, the lag detection unit 354 and the high gain signal generation unit 356 in FIG. 17 may be substantially the same as the lead detection unit 352, the lag detection unit 354 and the high gain signal generation unit 356 in FIG. 13, respectively, and thus further explanation will not be repeated.

The gain synchronization unit 358 may synchronize the high gain signal HGS with one of the reference signal FREF and the feedback input signal FFEEDI to generate a high gain output signal OHGS. For example, the high gain output signal OHGS may be synchronized with a rising edge or a falling edge of the reference signal FREF, or a rising edge or a falling edge of the feedback input signal FFEEDI.

The digital PFD 300 according to still other exemplary embodiments may generate the high gain output signal OHGS that indicates whether the phase difference between the reference signal FREF and the feedback input signal FFEEDI is greater than the predetermined phase difference. The high gain output signal OHGS may be synchronized with the edge of the reference signal FREF or the edge of the feedback input signal FFEEDI. Thus, the digital PFD 300 may effectively compensate the feedback input signal FFEEDI, and may have relatively high operation reliability and high operation stability.

Figure 18:
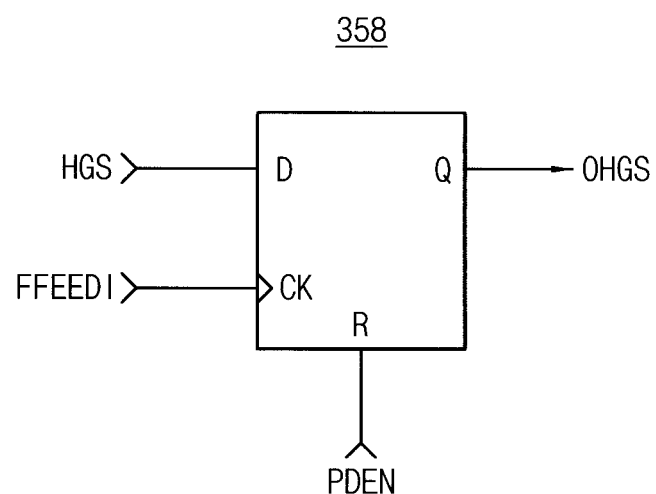
FIG. 18 is a block diagram illustrating an example of a gain synchronization unit included in the gain control unit of FIG. 17.

FIG. 18 is a block diagram illustrating an example of a gain synchronization unit included in the gain control unit of FIG. 17. The gain synchronization unit 358 may be a flip-flop. The flip-flop may have a data input terminal receiving the high gain signal HGS, a clock input terminal receiving the feedback input signal FFEEDI, a reset input terminal receiving the detection enable signal PDEN and an output terminal outputting the high gain output signal OHGS. The gain synchronization unit 358 may sample the high gain signal HGS based upon the feedback input signal FFEEDI to generate the high gain output signal OHGS.

Although the gain synchronization unit 358 performing the synchronization operation based upon the feedback input signal FFEEDI is illustrated in FIG. 18, the gain synchronization unit may perform the synchronization operation based upon the reference signal FREF. For example, the clock input terminal of the flip-flop in the gain synchronization unit may receive the reference signal FREF instead of the feedback input signal FFEEDI, and thus the high gain output signal OHGS may be synchronized with the rising edge or the falling edge of the reference signal FREF.

Figure 19:
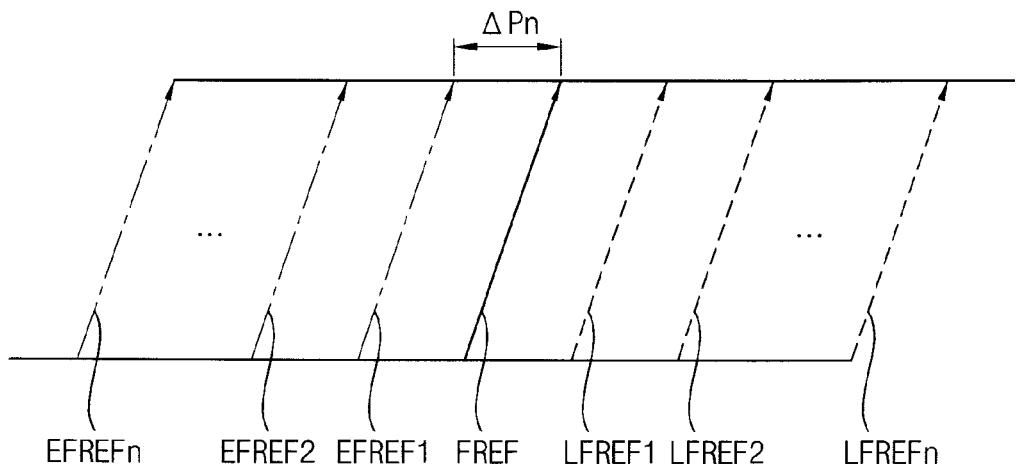
FIG. 19 is a diagram for describing an operation of the reference signal generation unit included in the digital PFD of FIG. 10.

FIG. 19 is a diagram for describing another operation of the reference signal generation unit 360 included in the digital PFD of FIG. 10. The reference signal generation unit 360 may generate the reference signals EFREF1, EFREF2, . . . , EFREFn, FREF, LFREF1, LFREF2, . . . , LFREFn by delaying the input signal FIN. The lead reference signal may include first through n-th lead reference signals EFREF1, . . . , EFREFn, where n is a natural number equal to or greater than two. A phase of each of the lead reference signals EFREF1, . . . , EFREFn may lead the phase of the reference signal FREF. The lag reference signal may include first through n-th lag reference signals LFREF1, . . . , LFREFn. A phase of each of the lag reference signals LFREF1, . . . , LFREFn may lag the phase of the reference signal FREF. A waveform of each of the lead reference signals EFREF1, . . . , EFREFn and a waveform of each of the lag reference signals LFREF1, . . . , LFREFn may be substantially the same as a waveform of the reference signal FREF.

In an exemplary embodiment, the phase of a k-th lead reference signal may lead the phase of a (k−1)-th lead reference signal by an unit phase, where k is a natural number equal to or greater than two and equal to or less than n. For example, a phase of the first lead reference signal EFREF1 may lead the phase of the reference signal FREF by about $\Delta Pn$, and a phase of the second lead reference signal EFREF2 may lead the phase of the first lead reference signal EFREF1 by about $\Delta Pn$. Similarly, a phase of a k-th lag reference signal may lag a phase of a (k−1)-th lag reference signal by the unit phase. A phase difference between the n-th lead reference signal EFREFn and the reference signal FREF may be from about 0 degree to about 180 degrees. In other words, a value of $(n*\Delta Pn)$ may be in a range of about 0 degree to about 180 degrees.

Figure 20:
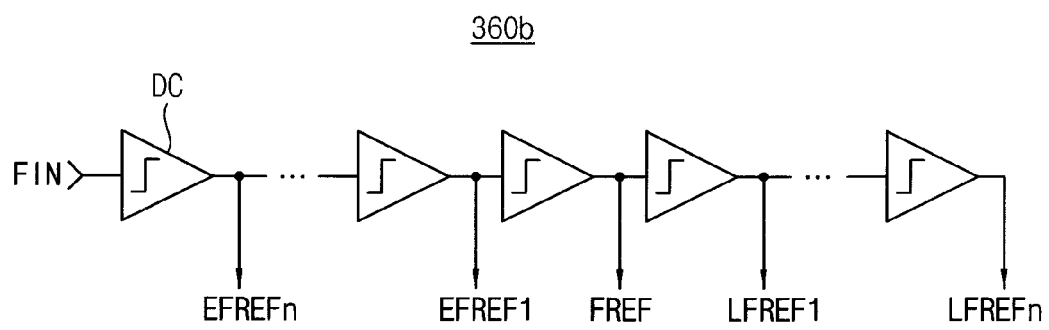
FIG. 20 is a block diagram illustrating an example of the reference signal generation unit included in the digital PFD of FIG. 10.

FIG. 20 is a block diagram illustrating another example of the reference signal generation unit 360 included in the digital PFD of FIG. 10. A reference signal generation unit 360b may include a plurality delay cells DC (e.g., (2n+1) delay cells) that are cascaded-coupled, and may sequentially generate the lead reference signals EFREF1 . . . , EFREFn, the reference signal FREF and the lag reference signals LFREF1, . . . , LFREFn by delaying the input signal FIN. For example, a first delay cell may delay the input signal FIN by a predetermined phase (e.g., $\Delta Pn$) to generate the n-th lead reference signal EFREFn, an n-th delay cell may delay the second lead reference signal EFREF2 by the predetermined phase to generate the first lead reference signal EFREF1, and a (2n+1)-th delay cell may delay a (n−1)-th lag reference signal by the predetermined phase to generate the n-th lag reference signal LFREFn.

Although not illustrated in FIG. 20, the reference signal generation unit may include 2n delay cells. For example, the reference signal generation unit may output the input signal FIN as the n-th lead reference signal EFREFn, and may generate a (n−1)-th lead reference signal by delaying the n-th lead reference signal EFREFn.

Figure 21:
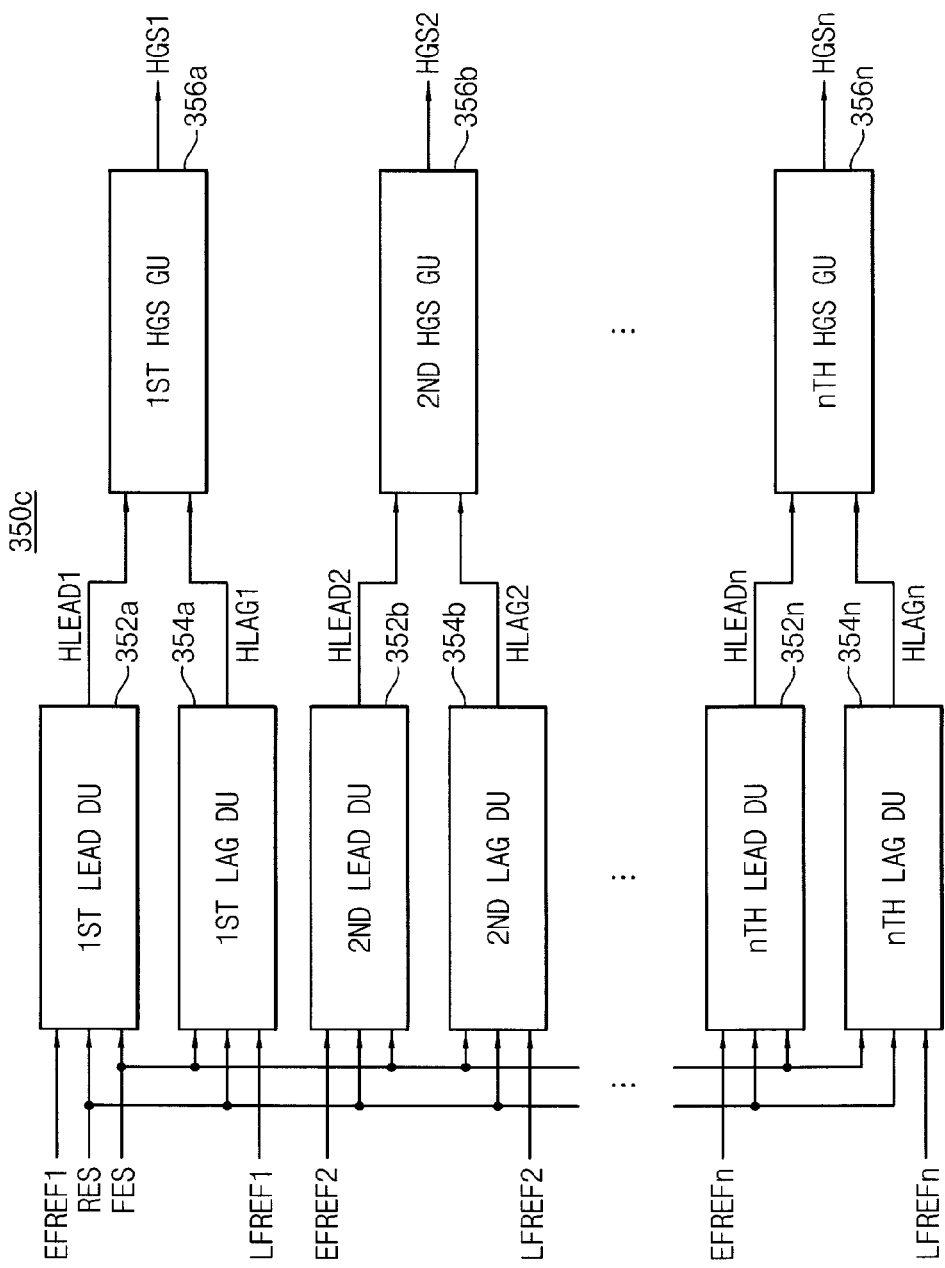
FIG. 21 is a block diagram illustrating an example of the gain control unit included in the digital PFD of FIG. 10.

FIG. 21 is a block diagram illustrating still another example of the gain control unit 350 included in the digital PFD of FIG. 10. A gain control unit 350c may include first through n-th lead detection units 352a, 352b, . . . , 352n, first through n-th lag detection units 354a, 354b, . . . , 354n, and first through n-th high gain signal generation units 356a, 356b, . . . , 356n.

Each of the lead detection units 352a, . . . , 352n may generate a respective one of first through n-th high lead signals HLEAD1, HLEAD2, . . . , HLEADn based upon a respective one of the first through n-th lead reference signals EFREF1, EFREF2, . . . , EFREFn, the reference edge signal RES and the feedback edge signal FES. Each of the high lead signals HLEAD1, . . . , HLEADn may indicate whether the phase of the feedback input signal FFEEDI leads a phase of the respective one of the lead reference signals EFREF1, . . . , EFREFn. For example, the first lead detection unit 352a may generate the first high lead signal HLEAD1 based upon the first lead reference signal EFREF1, the reference edge signal RES and the feedback edge signal FES. The first high lead signal HLEAD1 may indicate whether the phase of the feedback input signal FFEEDI leads a phase of the first lead reference signal EFREF1.

Each of the lag detection units 354a, . . . , 354n may generate a respective one of first through n-th high lag signals HLAG1, HLAG2, . . . , HLAGn based upon a respective one of the first through n-th lag reference signals LFREF1, LFREF2, . . . , LFREFn, the reference edge signal RES and the feedback edge signal FES. Each of the high lag signals HLAG1, . . . , HLAGn may indicate whether the phase of the feedback input signal FFEEDI lags a phase of the respective one of the lag reference signals LFREF1, . . . , LFREFn. For example, the first lag detection unit 354a may generate the first high lag signal HLAG1 based upon the first lag reference signal LFREF1, the reference edge signal RES and the feedback edge signal FES. The first high lag signal HLAG1 may indicate whether the phase of the feedback input signal FFEEDI lags a phase of the first lag reference signal LFREF1.

Each of the high gain signal generation units 356a, . . . , 356n may generate a respective one of first through n-th high gain signals HGS1, HGS2, . . . , HGSn based upon the respective one of the first through n-th high lead signals HLEAD1, . . . , HLEADn and the respective one of the first through n-th high lag signals HLAG1, . . . , HLAGn. For example, the first high gain signal generation unit 356a may generate the first high gain signal HGS1 based upon the first high lead signal HLEAD1 and the first high lag signal HLAG1.

Each of the high gain signals HGS1, . . . , HGSn may be activated when the phase difference between the reference signal FREF and the feedback input signal FFEEDI is greater than a respective one of predetermined phase differences. For example, if the phase difference between the reference signal FREF and the feedback input signal FFEEDI is greater than about ΔPn, in other words, if the phase of the feedback input signal FFEEDI leads the phase of the first lead reference signal EFREF1 or lags the phase of the first lag reference signal LFREF1, the first high gain signal HGS1 may be activated. If the phase difference between the reference signal FREF and the feedback input signal FFEEDI is greater than about (2*ΔPn), in other words, if the phase of the feedback input signal FFEEDI leads a phase of the second lead reference signal EFREF2 or lags a phase of the second lag reference signal LFREF2, the second high gain signal HGS2 may be activated.

In an exemplary embodiment, each of the lead detection units 352a, . . . , 352n may have substantially the same structure as the lead detection unit 352 in FIG. 14, each of the lag detection units 354a, . . . , 354n may have substantially the same structure as the lag detection unit 354 in FIG. 14, each of the high gain signal generation units 356a, . . . , 356n may have substantially the same structure as the high gain signal generation unit 356 in FIG. 14.

In the digital PFD 300 according to still other exemplary embodiments, the gain control unit 350c may generate a plurality of high gain signals HGS1, . . . , HGSn each of which precisely indicates whether the phase of the feedback input signal FFEEDI leads or lags the phase of the reference signal FREF. Thus, the digital PFD 300 may compensate the feedback input signal FFEEDI with relatively reduced compensation time, and a digital PLL including the digital PFD 300 may lock a phase and a frequency of an output signal with relatively reduced lock time.

Figure 22:
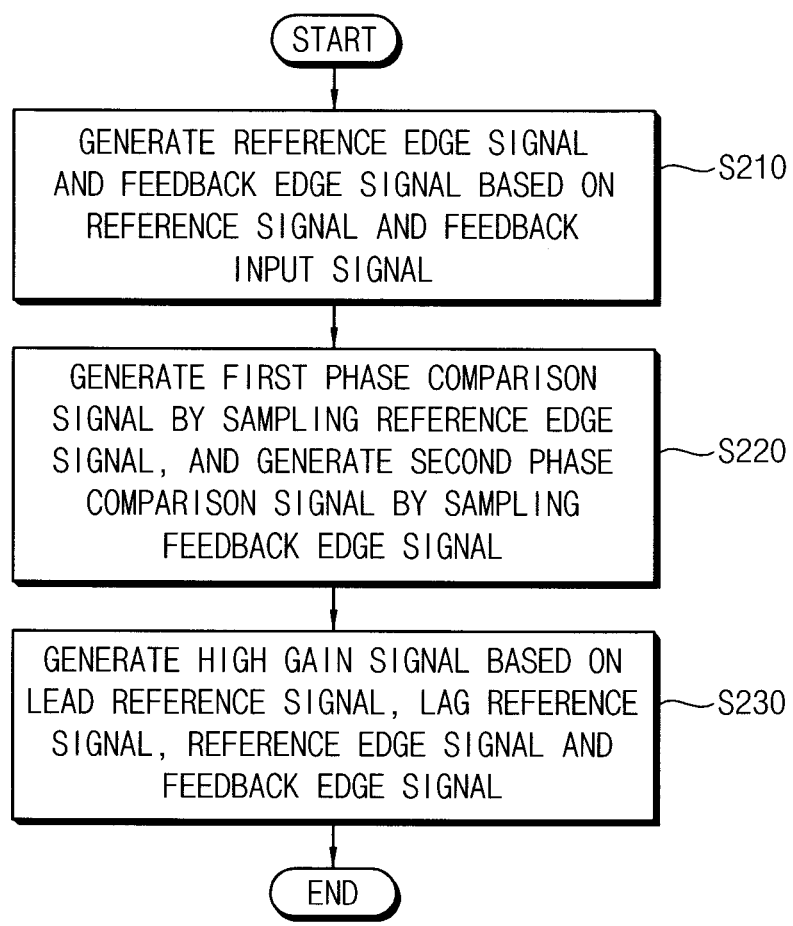
FIG. 22 is a flow chart illustrating a method of detecting the phase and frequency of an output signal according to an exemplary embodiment.

FIG. 22 is a flow chart illustrating a method of detecting a phase and a frequency of an output signal according to an exemplary embodiment.

Referring to FIGS. 10, 13, 17 and 22, in the method a reference edge signal RES and a feedback edge signal FES are generated by detecting an edge of a reference signal FREF and an edge of a feedback input signal FFEEDI (step S210). A first phase comparison signal PCS1 is generated by sampling the reference edge signal RES in response to the feedback edge signal FES, and a second phase comparison signal PCS2 is generated by sampling the feedback edge signal FES in response to the reference edge signal RES (step S220). The steps S210 and S220 may be substantially the same as the steps S110 and S120 in FIG. 9, respectively.

A high gain signal HGS is generated based upon a lead reference signal EFREF, a lag reference signal LFREF, the reference edge signal RES and the feedback edge signal FES (step S230). The high gain signal HGS indicates whether a phase difference between the reference signal FREF and the feedback input signal FFEEDI is greater than a predetermined phase difference.

In an exemplary embodiment, the lead reference signal EFREF, the reference signal FREF and the lag reference signal LFREF may be further generated based upon an input signal FIN. In another exemplary embodiment, a high gain output signal OHGS may be further generated by synchronizing the high gain signal HGS with one of the reference signal FREF and the feedback input signal FFEEDI.

In the method of detecting the phase and the frequency of the output signal according to other exemplary embodiments, the high gain signal HGS for controlling a compensate level of the feedback input signal FFEEDI is generated based upon the lead reference signal EFREF and the lag reference signal LFREF. Thus, a digital PFD (e.g., the digital PFD 300 of FIG. 10) operated by the method of FIG. 22 according to other exemplary embodiments may have a relatively reduced compensation time, a simple structure, a high operating speed and effective performance.

Figure 23:
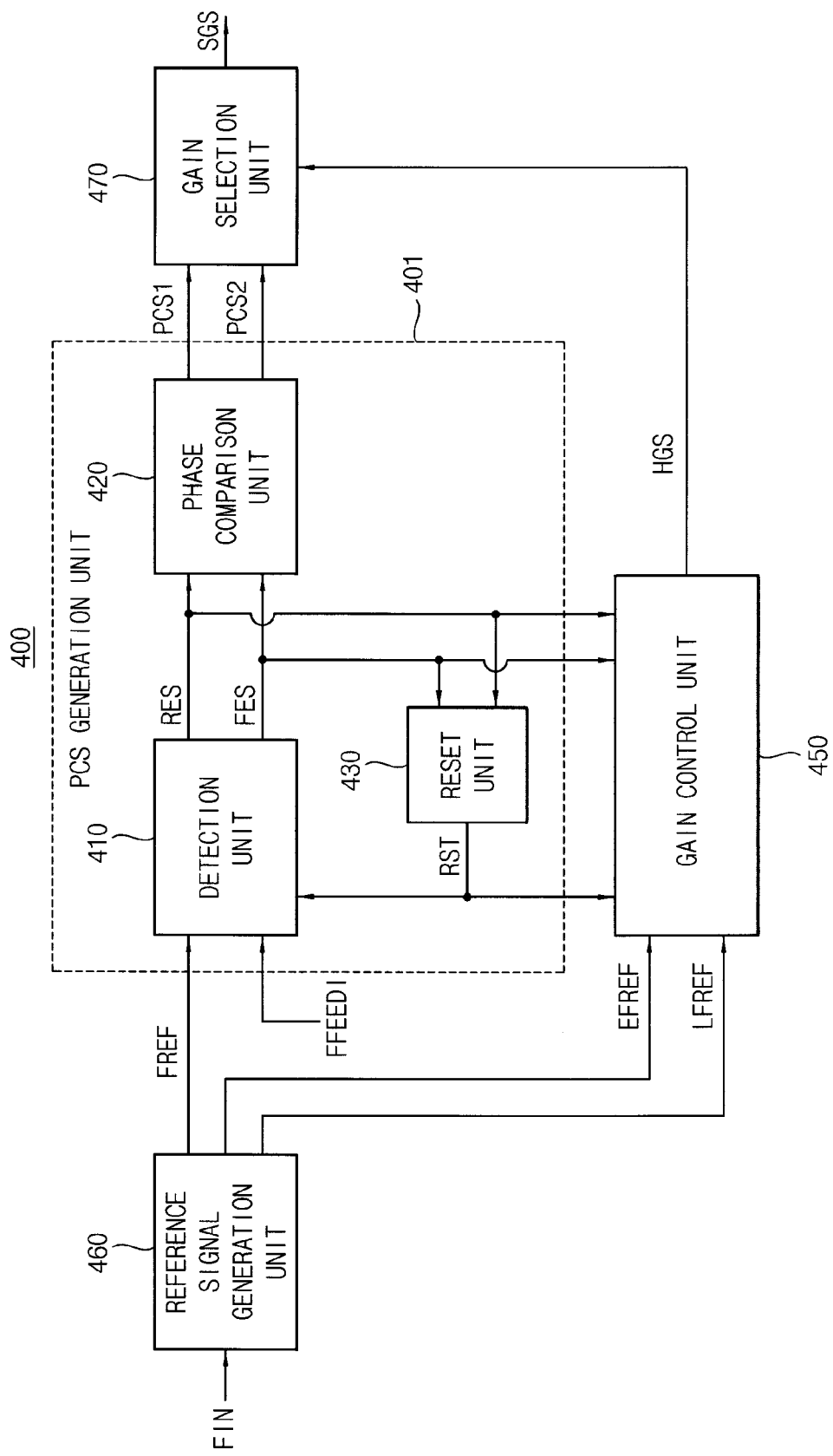
FIG. 23 is a block diagram illustrating a digital PFD according to an exemplary embodiment.

FIG. 23 is a block diagram illustrating a digital PFD according to an exemplary embodiment.

Referring to FIG. 23, a digital PFD 400 includes a reference signal generation unit 460, a phase comparison signal generation unit 401 and a gain control unit 450, and further includes a gain selection unit 470.

In comparison to the digital PFD 300 of FIG. 10, the digital PFD 400 further includes the gain selection unit 470. The reference signal generation unit 460, the phase comparison signal generation unit 401 and the gain control unit 450 in FIG. 23 may be substantially the same as the reference signal generation unit 360, the phase comparison signal generation unit 301 and the gain control unit 350 in FIG. 10, respectively, and thus further explanation will not be repeated.

The gain selection unit 470 may generate a selection gain signal SGS based upon the high gain signal HGS, and based upon one of the first phase comparison signal PCS1 and the second phase comparison signal PCS2. The selection gain signal SGS may be a digital value that corresponds to the phase difference between the reference signal FREF and the feedback input signal FFEEDI.

In an exemplary embodiment, the selection gain signal SGS may have a first digital value when the high gain signal HGS is deactivated, and may have a second digital value when the high gain signal HGS is activated. A magnitude of the second digital value may be greater than a magnitude of the first digital value. A sign of the second digital value may be substantially the same as a sign of the first digital value. In an exemplary embodiment where the phase of the feedback input signal FFEEDI leads the reference signal FREF, the first digital value may correspond to an unit gain (e.g., the unit gain UG in FIG. 11) for delaying the feedback input signal FFEEDI by a first predetermined phase. The second digital value may correspond to an adjusted gain (e.g., the adjusted gain HG in FIG. 11) for delaying the feedback input signal FFEEDI by a second predetermined phase. The second predetermined phase may be greater than the first predetermined phase.

In an exemplary embodiment, the magnitude of the second digital value may be greater than the magnitude of the first digital value by a predetermined gain ratio. For example, the predetermined gain ratio may be represented by Equation 1.

$$GR = \frac{HG}{UG} \quad \text{[Equation 1]}$$

In the Equation 1, GR represents the predetermined gain ratio, UG represents the magnitude of the first digital value (e.g., the unit gain) for compensating the feedback input signal FFEEDI when the high gain signal HGS is deactivated, and HG represents the magnitude of the second digital value (e.g., the adjusted gain) for compensating the feedback input signal FFEEDI when the high gain signal HGS is activated. For example, a value of the predetermined gain ratio may be in a range of about two to about eight. If the value of the predetermined gain ratio is smaller than about two, the compensation time for the feedback input signal FFEEDI may not be effectively reduced. If the value of the predetermined gain ratio is greater than about eight, the digital PFD 400 may not accurately perform the compensation operation for the feedback input signal FFEEDI.

Figure 24:
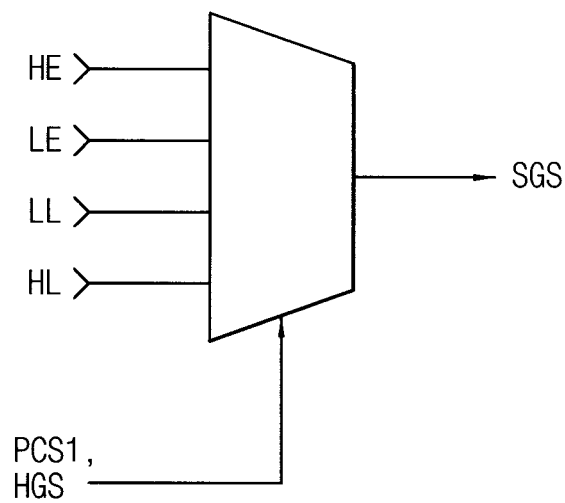
FIG. 24 is a block diagram illustrating an example of a gain selection unit included in the digital PFD of FIG. 23.

FIG. 24 is a block diagram illustrating an example of a gain selection unit 470 included in the digital PFD of FIG. 23. The gain selection unit 470 may be a multiplexer. The multiplexer may output one of digital values HE, LE, LL, HL as the selection gain signal SGS based upon the first phase comparison signal PCS1 and the high gain signal HGS.

In an exemplary embodiment, the multiplexer may select a digital value for delaying (i.e., shifting backward) the phase of the feedback input signal FFEEDI when the first phase comparison signal PCS1 is deactivated, and may select a digital value for shifting the phase of the feedback input signal FFEEDI forward when the first phase comparison signal PCS1 is activated. In addition, the multiplexer may select a digital value for compensating the feedback input signal FFEEDI with relatively low gain (e.g., the unit gain) when the high gain signal HGS is deactivated, and may select a digital value for compensating the feedback input signal FFEEDI with relatively high gain (e.g., the adjusted gain) when the high gain signal HGS is activated.

In an exemplary embodiment, each of the digital values HE, LE, LL, HL may correspond to the feedback gain used to adjust the phase and the frequency of the feedback input signal FFEEDI. For example, a first digital value HE may correspond to a first adjusted gain for delaying the phase of the feedback input signal FFEEDI with the relatively high gain. A second digital value LE may correspond to a first unit gain for delaying the phase of the feedback input signal FFEEDI with the relatively low gain. A third digital value LL may correspond to a second unit gain for shifting the phase of the feedback input signal FFEEDI forward with the relatively low gain. A fourth digital value HL may correspond to a second adjusted gain for shifting the phase of the feedback input signal FFEEDI forward with the relatively high gain. For example, assuming that the predetermined gain ratio GR is set to about eight, the digital values HE, LE, LL, HL may correspond to "−8", "−1", "+1", "+8", respectively.

In an exemplary embodiment, the multiplexer may select one of the first and second digital values HE, LE when the first phase comparison signal PCS1 is deactivated, and may select one of the third and fourth digital values LL, HL when the first phase comparison signal PCS1 is activated. In addition, the multiplexer may select one of the second and third digital values LE, LL when the high gain signal HGS is deactivated, and may select one of the first and fourth digital values HE, HL when the high gain signal HGS is activated. For example, when both the first phase comparison signal PCS1 and the high gain signal HGS are activated, the multiplexer may select the fourth digital value HL to output the fourth digital value HL as the selection gain signal SGS. In other words, assuming that the digital values HE, LE, LL, HL may correspond to "−8", "−1", "+1", "+8", respectively, a sign of the selection gain signal SGS may be determined in response to the first phase comparison signal PCS1, and a magnitude of the selection gain signal SGS may be determined in response to the high gain signal HGS.

Although the gain selection unit 470 using the first phase comparison signal PCS1 as a selection signal is illustrated in FIG. 24, the gain selection unit may use the second phase comparison signal PCS2 as the selection signal. Although the gain selection unit 470 selecting one of the four digital values HE, LE, LL, HL as the selection gain signal SGS is illustrated in FIG. 24, the gain selection unit may select one of a plurality of digital values as the selection gain signal. For example, as described above with reference to FIGS. 19 and 21, the high gain signal may include the first through n-th high gain signals, and the gain selection unit may select one of 2*(n+1) digital values as the selection gain signal, based upon one of the first and second phase comparison signals PCS1, PCS1 and the first through n-th high gain signals.

Figure 25:
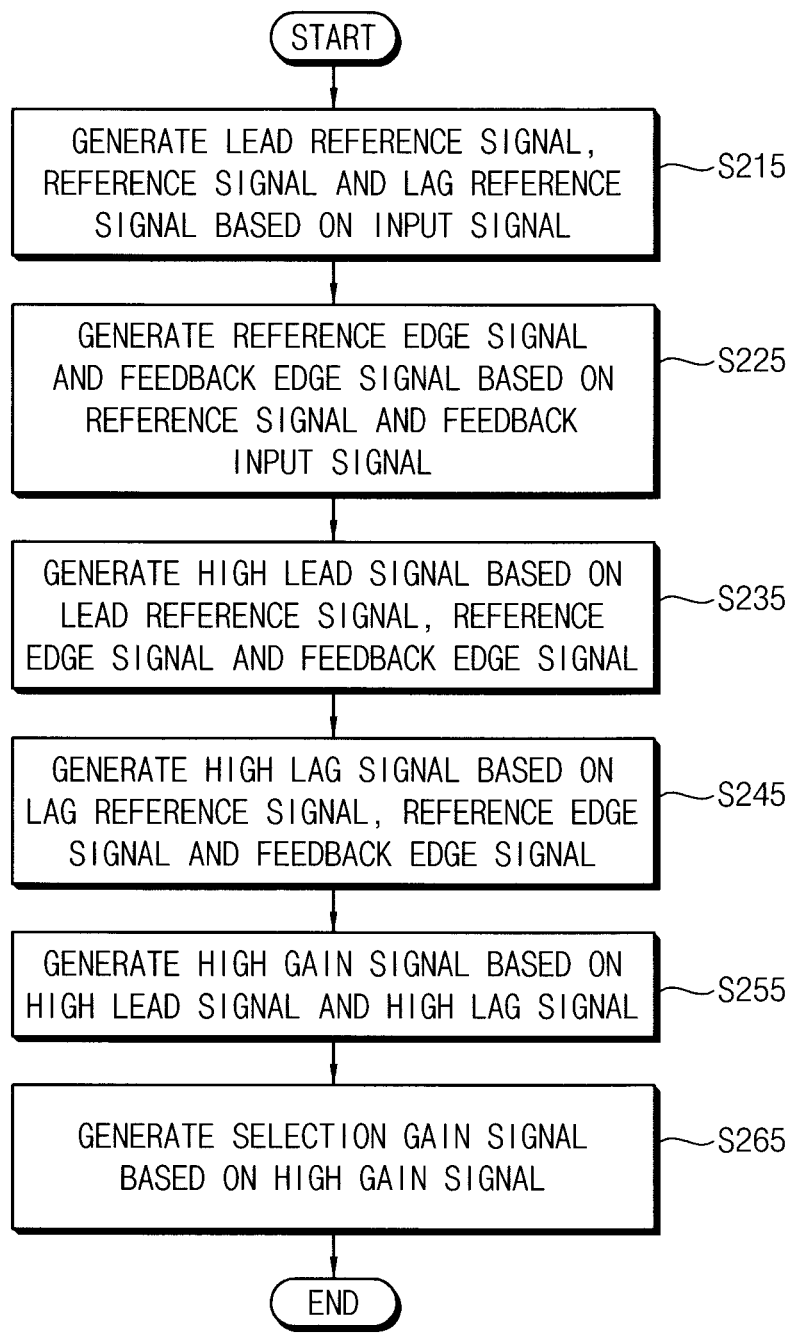
FIG. 25 is a flow chart illustrating a method of detecting the phase and frequency of an output signal according to an exemplary embodiment.

FIG. 25 is a flow chart illustrating a method of detecting a phase and a frequency of an output signal according to still other exemplary embodiments.

Referring to FIGS. 10, 13, 23 and 25, in the method a lead reference signal EFREF, a reference signal FREF and a lag reference signal LFREF are generated based upon an input signal FIN (step S215). A phase of the lead reference signal EFREF may lead a phase of the reference signal FREF, and a phase of the lag reference signal LFREF may lag a phase of the reference signal FREF.

A reference edge signal RES and a feedback edge signal FES are generated based upon the reference signal FREF and a feedback input signal FFEEDI (step S225). For example, the reference edge signal RES may be generated by detecting an edge of the reference signal FREF, and the feedback edge signal FES may be generated by detecting an edge of the feedback input signal FFEEDI.

A high lead signal HLEAD is generated based upon the lead reference signal EFREF, the reference edge signal RES and the feedback edge signal FES (step S235). A high lag signal HLAG is generated based upon the lag reference signal LFREF1, the reference edge signal RES and the feedback edge signal FES (step S245). The high lead signal HLEAD indicates whether a phase of the feedback input signal FFEEDI leads the phase of the lead reference signal EFREF. The high lag signal HLAG indicates whether the phase of the feedback input signal FFEEDI lags the phase of the lag reference signal LFREF.

A high gain signal HGS is generated based upon the high lead signal HLEAD and the high lag signal HLAG (step S255). The high gain signal HGS indicates whether the feedback input signal FFEEDI is compensated based upon an unit gain or an adjusted gain being greater than the unit gain.

In an exemplary embodiment, a selection gain signal SGS may be further generated based upon the high gain signal HGS (step S265). The high gain signal HGS may be activated when the phase of the feedback input signal FFEEDI leads the phase of the lead reference signal EFREF or lags the phase of the lag reference signal LFREF. The selection gain signal SGS may correspond to the adjusted gain when the high gain signal HGS is activated, and may correspond to the unit gain when the high gain signal HGS is deactivated.

In an exemplary embodiment, a first phase comparison signal PCS1 and a second phase comparison signal PCS2 may be further generated based upon the reference edge signal RES and the feedback edge signal FES.

Figure 26:
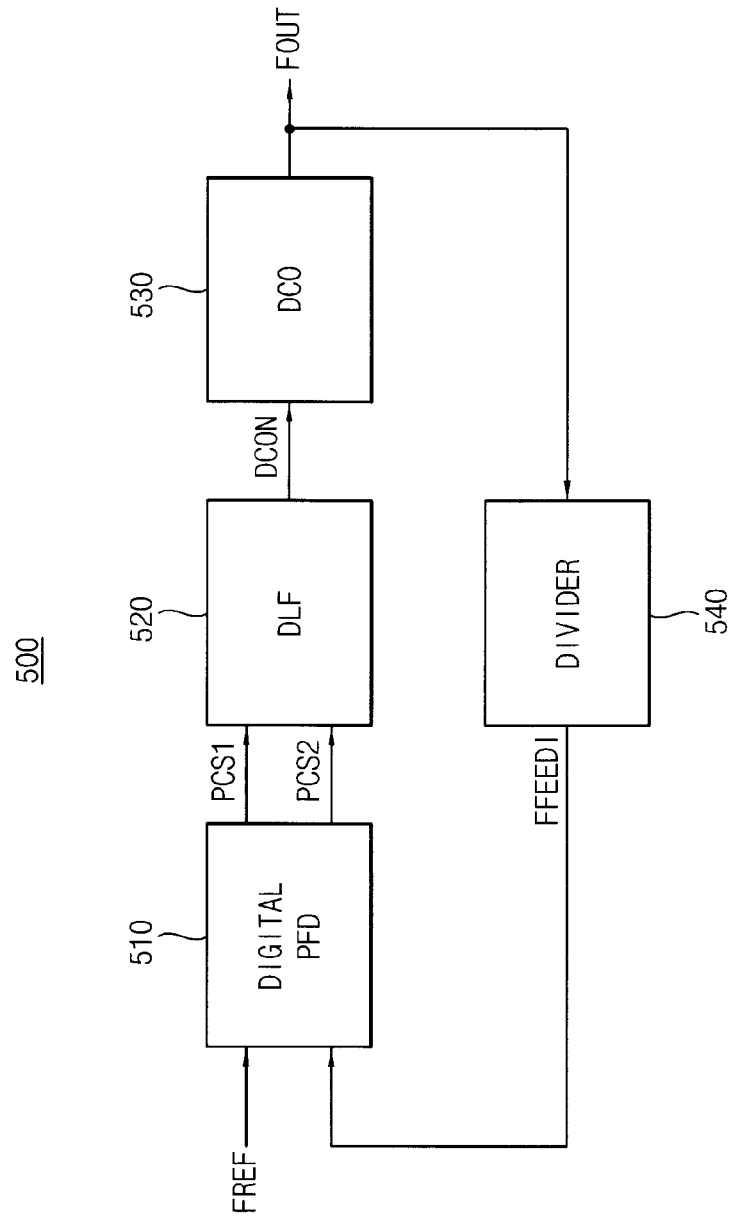
FIG. 26 is a block diagram illustrating a digital phase locked loop (PLL) according to an exemplary embodiment.

FIG. 26 is a block diagram illustrating a digital phase locked loop (PLL) according to an exemplary embodiment. A digital PLL 500 includes a digital phase frequency detector (PFD) 510, a digital loop filter (DLF) 520, a digitally controlled oscillator (DCO) 530 and a divider 540.

The digital PFD 510 generates a first phase comparison signal PCS1 and a second phase comparison signal PCS2 based upon a reference signal FREF and a feedback input signal FFEEDI. The first and second phase comparison signals PCS1, PCS2 indicate whether a phase of the feedback input signal FFEEDI leads or lags a phase of the reference signal FREF.

The digital PFD 510 may be one of the digital PFD 100 of FIG. 1 and the digital PFD 200 of FIG. 7. For example, the digital PFD 510 includes a detection unit, a reset unit and a phase comparison unit, and may further include a synchronization unit. If the digital PFD 510 may be the digital PFD 200 of FIG. 7, in other words, if the digital PFD 510 may further include the synchronization unit, the first and second phase comparison signals PCS1, PCS2 may correspond to the first and second phase comparison output signals OPCS1, OPCS2 in FIG. 7, respectively.

The detection unit detects an edge of the reference signal FREF and an edge of the feedback input signal FFEEDI to generate a reference edge signal and a feedback edge signal. The reset unit generates a reset signal resetting the detection unit based upon the reference edge signal and the feedback edge signal. The phase comparison unit includes a first flip-flop, a second flip-flop and a latch block. The first flip-flop has a data input terminal receiving the feedback edge signal and a clock input terminal receiving the reference edge signal, and generates a first comparison signal by sampling the reference edge signal in response to the feedback edge signal. The second flip-flop has a data input terminal receiving the feedback edge signal and a clock input terminal receiving the reference edge signal, and generates a second comparison signal by sampling the feedback edge signal in response to the reference edge signal. The latch latches the first comparison signal and the second comparison signal to generate the first phase comparison signal PCS1 and the second phase comparison signal PCS2.

The DLF 520 generates a digital control signal DCON for adjusting a phase and a frequency of an output signal FOUT based upon the first and second phase comparison signals PCS1, PCS2. For example, if a phase difference and a frequency difference between the reference signal FREF and the feedback input signal FFEEDI are greater than a threshold phase difference and a threshold frequency difference, the DLF 520 may provide the digital control signal DCON to the DCO 530, and the DCO 530 may control the phase and the frequency of an output signal FOUT. In an exemplary embodiment, the DLF 520 may include a multiplexer and an accumulator. The multiplexer may select one of the digital values based upon one of the first and second phase comparison signals PCS1, PCS2. The accumulator may accumulate the selected digital value to generate the digital control signal DCON.

The DCO 530 generates the output signal FOUT based upon the digital control signal DCON. The divider 540 divides the output signal FOUT to generate the feedback input signal FFEEDI. The feedback input signal FFEEDI is provided to the digital PFD 510.

In an exemplary embodiment, the digital PLL 500 may be an all-digital PLL. For example, in the digital PLL 500, all elements except for the DCO 530 may be implemented with digital logic, and thus the digital PLL 500 may have a relatively robust performance against process, voltage, and temperature (PVT) variations.

The digital PLL 500 according to an exemplary embodiment includes one of the digital PFD 100 of FIG. 1 and the digital PFD 200 of FIG. 7. Thus, the digital PLL 500 may have a relatively simple structure and a high operating speed, and may accurately lock a phase and a frequency of the output signal FOUT.

Figure 27:
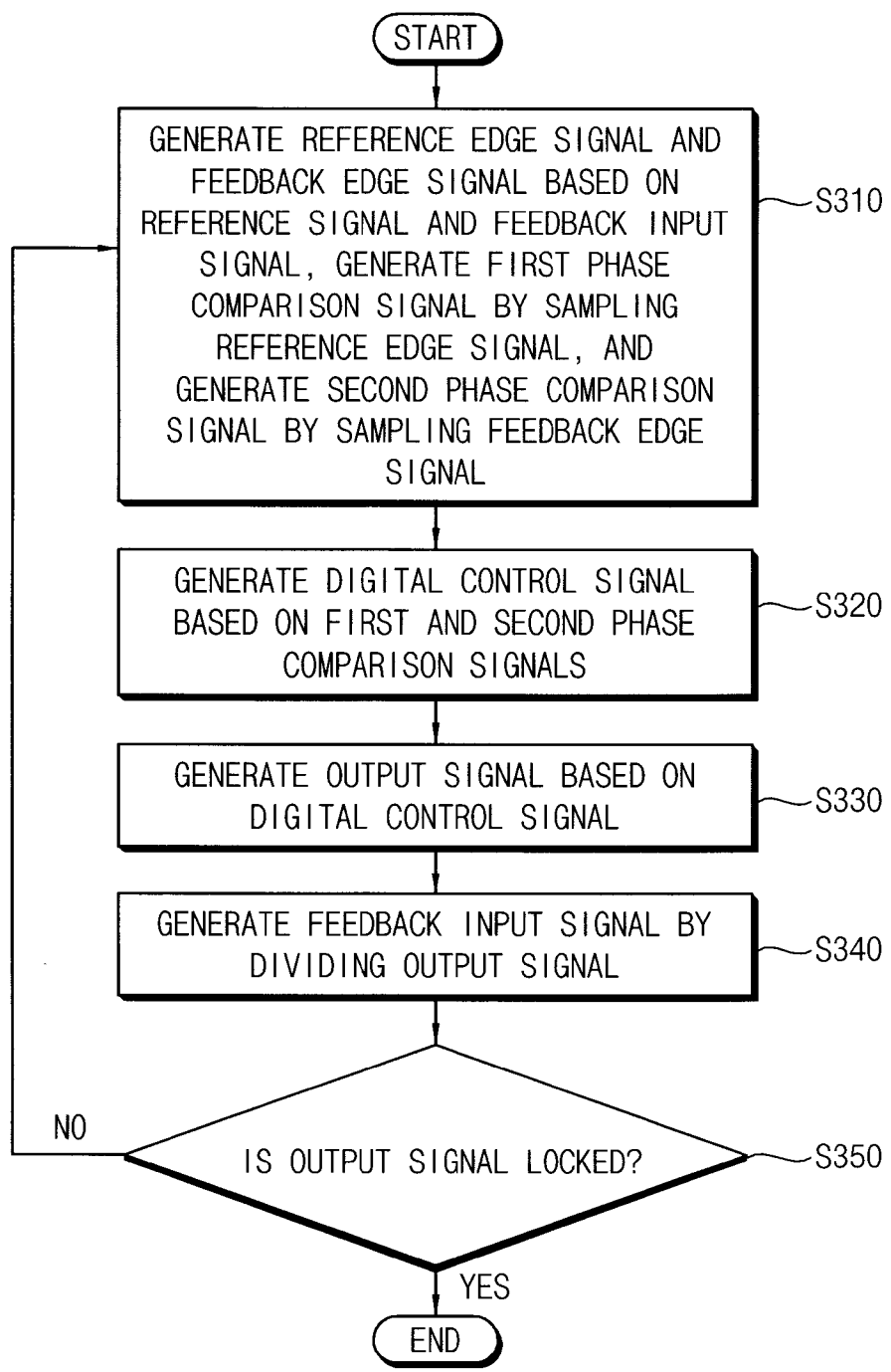
FIG. 27 is a flow chart illustrating a method of adjusting the phase and frequency of an output signal according to an exemplary embodiment.

FIG. 27 is a flow chart illustrating a method of adjusting a phase and a frequency of an output signal according to an exemplary embodiment.

Referring to FIGS. 1, 26 and 27, in the method a reference edge signal RES and a feedback edge signal FES are generated based upon the a reference signal and a feedback edge signal FFEEDI, a first phase comparison signal PCS1 is generated by sampling the reference edge signal RES in response to the feedback edge signal FES, and a second phase comparison signal PCS2 is generated by sampling the feedback edge signal FES in response to the reference edge signal RES (step S310). The step 310 may be substantially the same as the method of FIG. 9 including the steps S110, S120.

A digital control signal DCON is generated based upon the first phase comparison signal PCS1 and the second phase comparison signal PCS2 (step S320). The digital control signal DCON may be used for adjusting a phase and a frequency of an output signal FOUT.

The output signal FOUT is generated based upon the digital control signal DCON (step S330), and the feedback input signal FFEEDI is generated by dividing the output signal FOUT (step S340). A state of the output signal FOUT is determined by comparing the reference signal FREF and the feedback input signal FFEEDI (step S350). If the output signal FOUT is not locked, in other words, if a phase and a frequency of the reference signal FREF is different from a phase and a frequency of the feedback input signal FFEEDI, the steps S310, S320, S330, S340 may be repeated. If the output signal FOUT is locked, in other words, if the phase and the frequency of the reference signal FREF is substantially the same as the phase and the frequency of the feedback input signal FFEEDI, the method of FIG. 27 may be finished.

Figure 28:
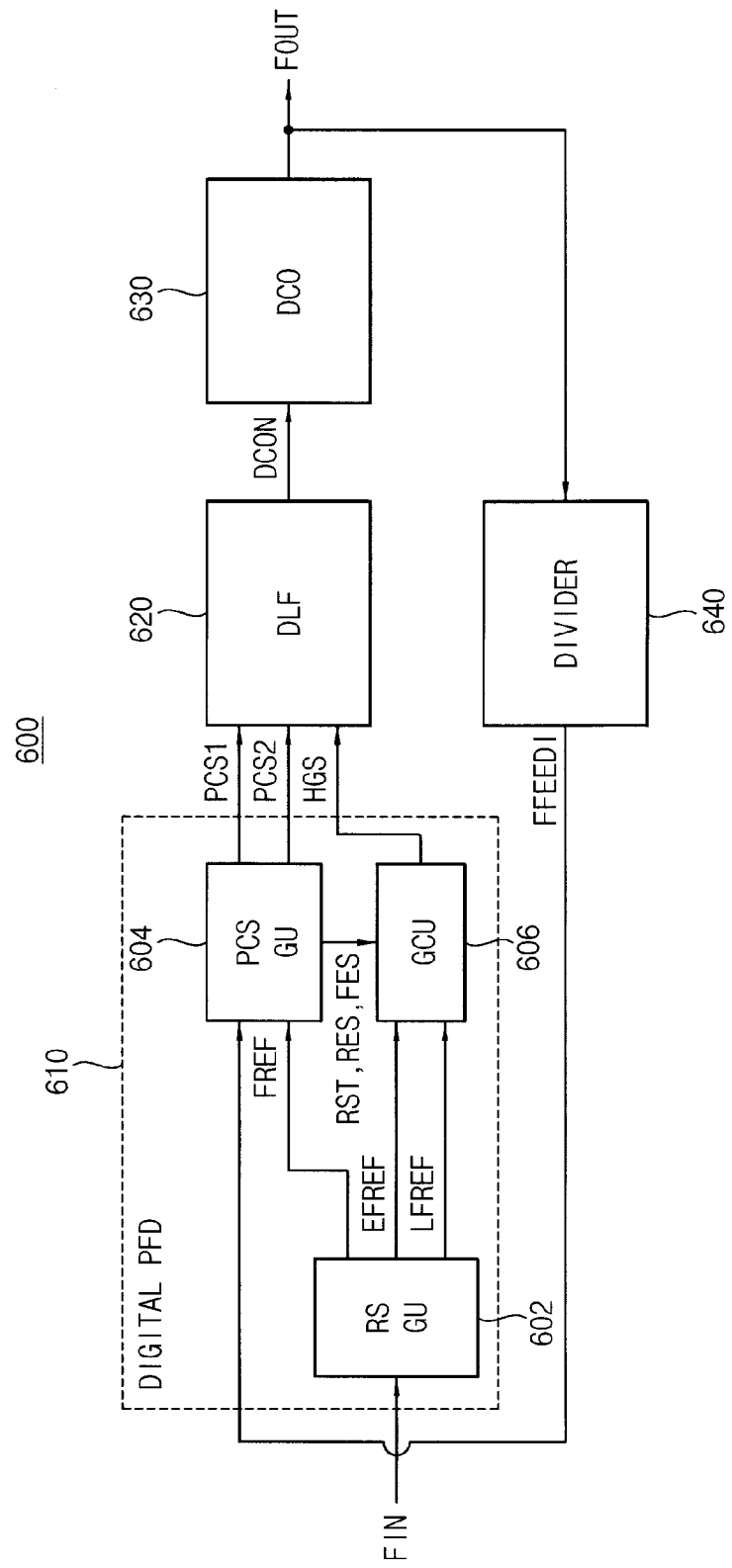
FIG. 28 is a block diagram illustrating a digital PLL according to an exemplary embodiment.

FIG. 28 is a block diagram illustrating a digital PLL according to an exemplary embodiment.

Referring to FIG. 28, a digital PLL 600 includes a digital PFD 610, a DLF 620, a DCO 630 and a divider 640. In comparison to the digital PLL 500 of FIG. 26, the digital PLL 600 includes the digital PFD 610 and the DLF 620 instead of the digital PFD 510 and the DLF 520. The DCO 630 and the divider 640 in FIG. 28 may be substantially the same as the DCO 530 and the divider 540 in FIG. 26, respectively, and thus further explanation will not be repeated.

The digital PFD 610 generates a lead reference signal EFREF, a reference signal FREF and a lag reference signal LFREF based upon an input signal FIN, generates a reference edge signal RES and a feedback edge signal FES based upon the reference signal FREF and a feedback input signal FFEEDI, generates a first phase comparison signal PCS1 and a second phase comparison signal PCS2 based upon the reference edge signal RES and the feedback edge signal FES, and generates a high gain signal HGS based upon the lead reference signal EFREF, the lag reference signal LFREF, the reference edge signal RES and the feedback edge signal FES. The first and second phase comparison signals PCS1, PCS2 indicate whether a phase of the feedback input signal FFEEDI leads or lags a phase of the reference signal FREF. The high gain signal HGS indicates whether a phase difference between the reference signal FREF and the feedback input signal FFEEDI is greater than a predetermined phase difference.

In an exemplary embodiment, the digital PFD 610 may be the digital PFD 300 of FIG. 10. For example, the digital PFD 610 may include a reference signal generation unit 602, a phase comparison signal generation unit 604 and a gain control unit 606. The reference signal generation unit 602, the phase comparison signal generation unit 604 and the gain control unit 606 may be substantially the same as the reference signal generation unit 360, the phase comparison signal generation unit 301 and the gain control unit 350 in FIG. 10, respectively, and thus further explanation will not be repeated.

In another exemplary embodiment, the digital PFD 610 may be the digital PFD 400 of FIG. 23. For example, the digital PFD 610 may further include a gain selection unit (not illustrated) generating a selection gain signal SGS. In this case, the digital PFD 610 may only output the selection gain signal SGS.

The DLF 620 generates a digital control signal DCON for adjusting a phase and a frequency of an output signal FOUT based upon the high gain signal HGS, the first phase comparison signal PCS1 and second phase comparison signal PCS2.

In an exemplary embodiment, if the digital PFD 610 may be the digital PFD 300 of FIG. 10, the DLF 620 may select one of the digital values based upon the high gain signal HGS and based upon one of the first and second phase comparison signals PCS1, PCS2, and may accumulate the selected digital value to generate the digital control signal DCON. In this case, the DLF 620 may control a feedback gain used to adjust the phase and the frequency of the feedback input signal FFEEDI. For example, the DLF 620 may increase the feedback gain (e.g., select a digital value having relatively large magnitude) when the high gain signal HGS is activated, and the phase and the frequency of the feedback input signal FFEEDI may be adjusted with relatively high gain.

In another exemplary embodiment, if the digital PFD 610 may be the digital PFD 400 of FIG. 23, the DLF 620 may accumulate the selection gain signal SGS to generate the digital control signal DCON. As described above with reference to FIGS. 23 and 24, the selection gain signal SGS may be a digital value, and may indicate whether the phase of the feedback input signal FFEEDI is delayed or shifted forward, and whether the phase of the feedback input signal FFEEDI is compensated with relatively low gain or high gain.

The digital PLL 600 according to other exemplary embodiments includes one of the digital PFD 300 of FIG. 10 and the digital PFD 400 of FIG. 23. Thus, the time required to lock the phase and the frequency of the output signal FOUT of the digital PLL 600 may be effectively reduced without increasing jitter noise and/or phase noise.

Figure 29:
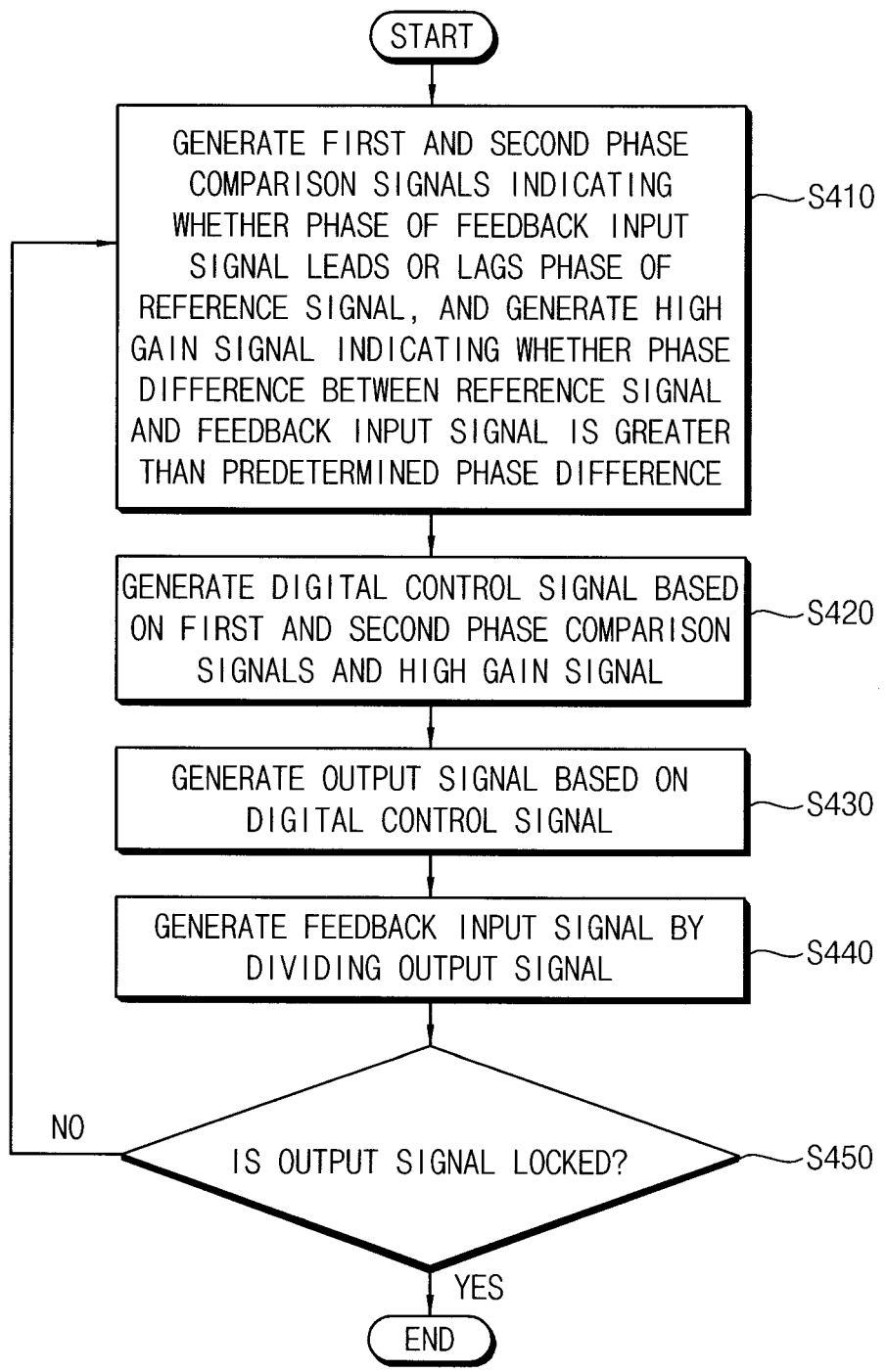
FIG. 29 is a flow chart illustrating a method of adjusting the phase and frequency of an output signal according to an exemplary embodiment.

FIG. 29 is a flow chart illustrating a method of adjusting a phase and a frequency of an output signal according to other exemplary embodiments.

Referring to FIGS. 10, 28 and 29, in the method a first phase comparison signal PCS1, a second phase comparison signal PCS2 and a high gain signal HGS are generated (step S410). The first and second phase comparison signals PCS1, PCS2 indicate whether a phase of a feedback input signal FFEEDI leads or lags a phase of a reference signal FREF. The feedback input signal FFEEDI may correspond to an output signal FOUT. The high gain signal HGS indicates whether a phase difference between the reference signal FREF and the feedback input signal FFEEDI is greater than a predetermined phase difference. The step 410 may be substantially the same as the method of FIG. 22 including the steps S210, S220 and S230.

A digital control signal DCON is generated based upon the first and second phase comparison signals PCS1, PCS2 and the high gain signal HGS (step S420). For example, one of digital values is selected based upon one of the first and second phase comparison signals PCS1, PCS2 and based upon the high gain signal HGS, and the digital control signal DCON is generated based upon the selected digital value. A sign of the selected digital value may be determined based upon one of the first and second phase comparison signals PCS1, PCS2, and a magnitude of the selected digital value may be determined based upon the high gain signal HGS.

The output signal FOUT is generated based upon the digital control signal DCON (step S430), and the feedback input signal FFEEDI is generated by dividing the output signal FOUT (step S440). A state of the output signal FOUT is determined by comparing the reference signal FREF and the feedback input signal FFEEDI (step S450). If the output signal FOUT is not locked, the steps S410, S420, S430, S440 may be repeated. If the output signal FOUT is locked, the method of FIG. 29 may be finished.

Figure 30:
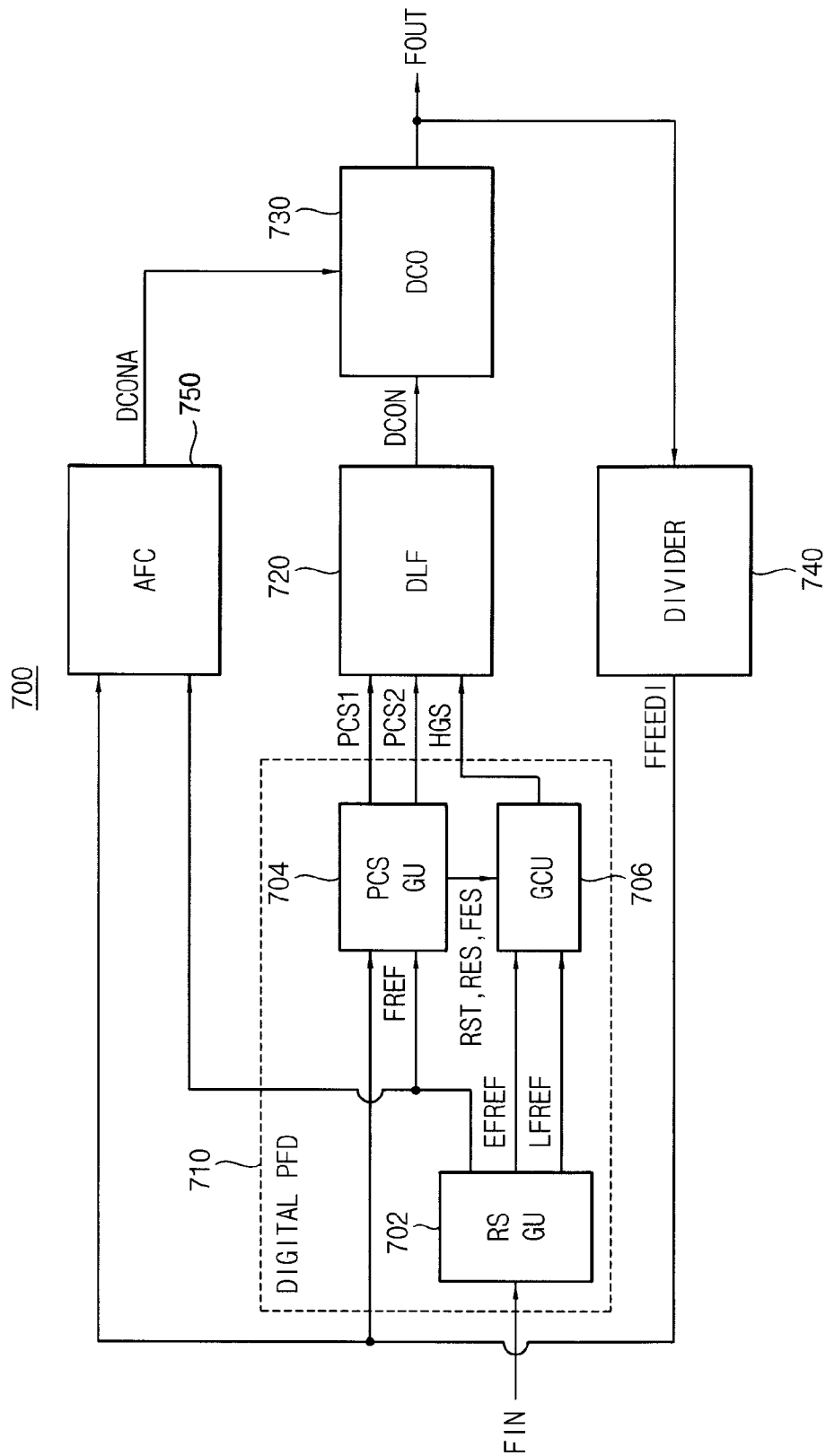
FIG. 30 is a block diagram illustrating a digital PLL according to an exemplary embodiment.

FIG. 30 is a block diagram illustrating a digital PLL according to an exemplary embodiment. A digital PLL 700 includes a digital PFD 710, a DLF 720, a DCO 730 and a divider 740, and may further include an automatic frequency controller (AFC) 750.

In comparison to the digital PLL 600 of FIG. 28, the digital PLL 700 includes the DCO 730 instead of the DCO 630, and may further include the AFC 750. The digital PFD 710 including a reference signal generation unit 702, a phase comparison signal generation unit 704 and a gain control unit 706, the DLF 720 and the divider 740 in FIG. 30 may be substantially the same as the digital PFD 610 including the reference signal generation unit 602, the phase comparison signal generation unit 604 and the gain control unit 606, the DLF 620 and the divider 640 in FIG. 28, respectively, and thus further explanation will not be repeated.

The AFC 750 may generate an automatic digital control signal DCONA adjusting an initial frequency of an output signal FOUT based upon a reference signal FREF and a feedback input signal FFEEDI. In an exemplary embodiment, the AFC 750 may include a counter and a comparator. The counter may count the number of pulses of the reference signal FREF and the feedback input signal FFEEDI. The comparator may compare the counting result for the reference signal FREF with the counting result for the feedback input signal FFEEDI. In an exemplary embodiment, the AFC 750 may be implemented with a dynamic binary branch scheme that is used for controlling the comparison operation.

The DCO 730 may generate the output signal FOUT based upon the automatic digital control signal DCONA and the digital control signal DCON. For example, the digital PLL 700 may operate alternatively in two modes, that is, a coarse mode and a fine mode. In the coarse mode, the digital PLL 700 may roughly adjust a phase and a frequency of the output signal FOUT, and may generate the output signal FOUT based upon the automatic digital control signal DCONA. In the fine mode, the digital PLL 700 may precisely adjust the phase and the frequency of the output signal FOUT, and may generate the output signal FOUT based upon the digital control signal DCON.

The digital PLL 700 according to still other exemplary embodiments includes one of the digital PFD 300 of FIG. 10 and the digital PFD 400 of FIG. 23. Thus, the time required to lock the phase and the frequency of the output signal FOUT in the digital PLL 700 may be effectively reduced without increasing jitter noise and/or phase noise. In addition, the digital PLL 700 may further include the AFC 750, and thus the lock time of the digital PLL 700 may be more reduced than the lock time of the digital PLL 600.

Figure 31:
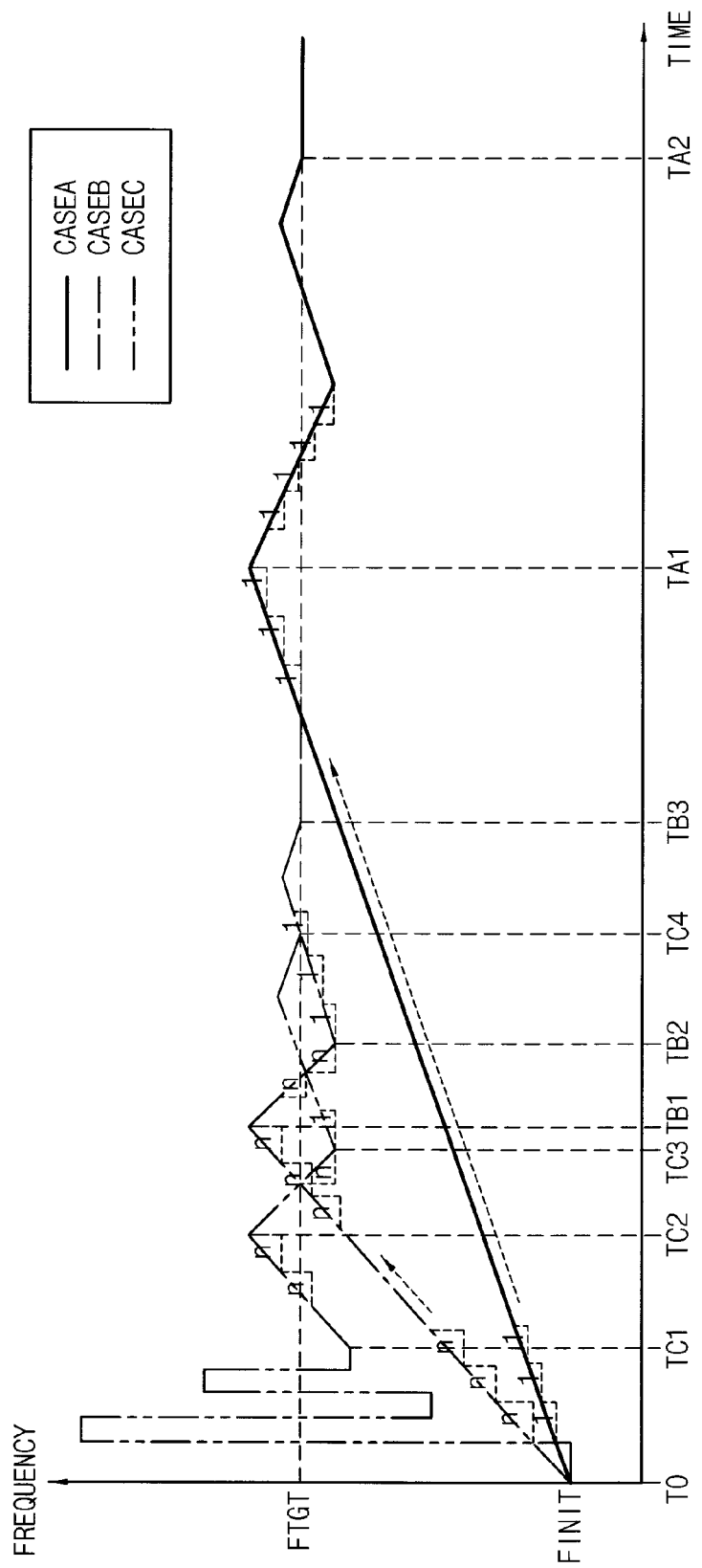
FIG. 31 is a diagram for describing the operation of the digital PLL according to an exemplary embodiment.

FIG. 31 is a diagram for describing an operation of the digital PLL according to some exemplary embodiments. FIG. 31 is a graph illustrating frequency variations of the output signal according to an operation of the digital PLL. In FIG. 31, CASEA indicates an output signal of a conventional digital PLL, CASEB indicates the output signal FOUT of the digital PLL 600 of FIG. 28, and CASEC indicates the output signal FOUT of the digital PLL 700 of FIG. 30.

Referring to FIG. 31, the conventional digital PLL may have a fixed feedback gain (e.g., a unit gain) during all of time intervals. During a frequency capture period (from time T0 to time TA1), the conventional digital PLL increases a frequency of the output signal by using the unit gain (e.g., "1"). During a phase capture period (from time TA1 to time TA2), the conventional digital PLL increases or decreases the frequency of the output signal by using the unit gain (e.g., "1"). During a phase lock period (after time TA2), the conventional digital PLL locks the frequency of the output signal. If an initial frequency FINIT of the output signal is excessively lower (or higher) than a target frequency FTGT, the conventional digital PLL may have relatively long lock time of the output signal.

Referring to FIGS. 28 and 31, the digital PLL 600 may have a variable feedback gain depending on a frequency difference (i.e., a phase difference) between the target frequency FTGT (i.e., the reference signal FREF) and the output signal FOUT (i.e., the feedback input signal FFEEDI). During a frequency capture period (from time T0 to time TB1), the digital PLL 600 increases a frequency of the output signal FOUT by using an adjusted gain (e.g., "n"). The adjusted gain (e.g., "n") is higher than the unit gain (e.g., "1"). As described above with reference to FIG. 23, a value of n is in a range of about two to about eight. During a first period (from time TB1 to time TB2) of a phase capture period, the digital PLL 600 decreases the frequency of the output signal FOUT by using the adjusted gain (e.g., "n"). During a second period (from time TB2 to time TB3) of the phase capture period, the digital PLL 600 increases or decreases the frequency of the output signal FOUT by using the unit gain (e.g., "1"). During a phase lock period (after time TB3), the digital PLL 600 locks the frequency of the output signal FOUT.

In an exemplary embodiment, an initial slope angle of the output signal FOUT may be greater than a final slope angle of the output signal FOUT. For example, during the frequency capture period and the first period of the phase capture period, the frequency difference between the target frequency FTGT and the output signal FOUT may be relatively large. Thus, the high gain signal HGS may be activated, the output signal FOUT may be adjusted by using the adjusted gain (e.g., "n"), and a slope angle (i.e., the initial slope angle) of the output signal FOUT may be relatively large. During the second period of the phase capture period, the frequency difference between the target frequency FTGT and the output signal FOUT may be relatively small. Thus, the high gain signal HGS may be deactivated, the output signal FOUT may be adjusted by using the unit gain (e.g., "1"), and a slope angle (i.e., the final slope angle) of the output signal FOUT may be relatively small.

In an exemplary embodiment, a time interval of the frequency capture period of the digital PLL 600 may be represented by Equation 2.

$$T2 = \frac{T1}{GR} \qquad \text{[Equation 2]}$$

In the Equation 2, GR represents the predetermined gain ratio (e.g., "n"), T1 represents a time interval of the frequency capture period of the conventional digital PLL (e.g., from time T0 to time TA1), and T2 represents the time interval of the frequency capture period of the digital PLL 600 (e.g., from time T0 to time TB1).

Referring to FIGS. 30 and 31, the digital PLL 700 may have a variable feedback gain depending on a frequency difference (i.e., a phase difference) between the target frequency FTGT and the output signal FOUT. During a first period (from time T0 to time TC1) of a frequency capture period, the digital PLL 700 roughly adjusts a frequency of the output signal FOUT by using the AFC 750. During a second period (from time TC1 to time TC2) of the frequency capture period, the digital PLL 700 increases the frequency of the output signal FOUT by using the adjusted gain (e.g., "n"). During a first period (from time TC2 to time TC3) of a phase capture period, the digital PLL 700 decreases the frequency of the output signal FOUT by using the adjusted gain (e.g., "n"). During a second period (from time TC3 to time TC4) of the phase capture period, the digital PLL 700 increases or decreases the frequency of the output signal FOUT by using the unit gain (e.g., "1"). During a phase lock period (after time TC4), the digital PLL 700 locks the frequency of the output signal FOUT. A time interval of the frequency capture period of the digital PLL 700 may be much more reduced by using the AFC 750.

Figure 32:
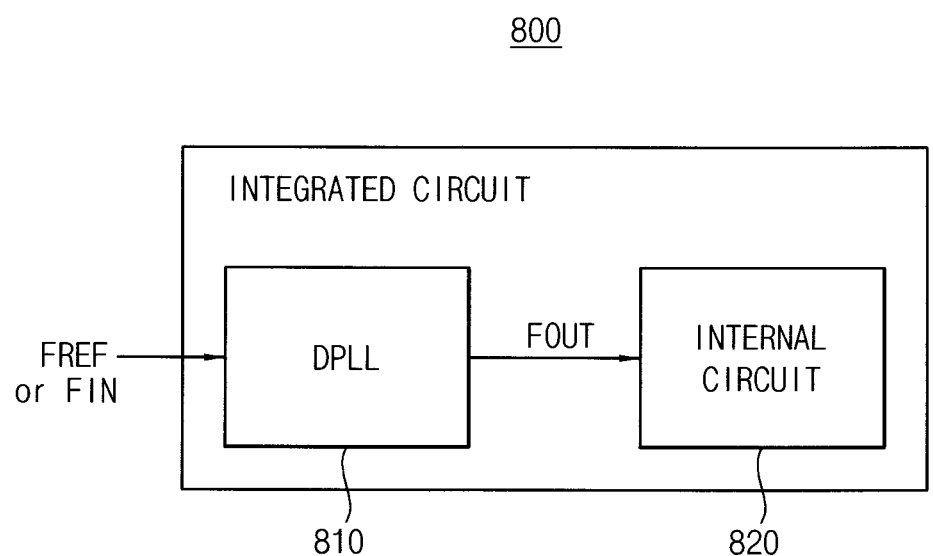
FIG. 32 is a block diagram illustrating an integrated circuit according to an exemplary embodiment.

FIG. 32 is a block diagram illustrating an integrated circuit according to an exemplary embodiment. An integrated circuit 800 includes a digital PLL 810 and an internal circuit 820. In some exemplary embodiments, the integrated circuit 800 may be one of various devices and/or systems, such as an application processor (AP), a microprocessor, a central processing unit (CPU), an application-specific integrated circuit (ASIC), a mobile system on chip (SoC), a multimedia SoC, a smart-card, etc.

The digital PLL 810 generates an output signal FOUT based upon one of a reference signal FREF and an input signal FIN, and maintains the output signal FOUT at a locked phase and a locked frequency. The reference signal FREF may be substantially the same as the input signal FIN or may be generated by delaying the input signal FIN. The digital PLL 810 may be one of the digital PLL 500 of FIG. 26, the digital PLL 600 of FIG. 28 and the digital PLL 700 of FIG. 30. For example, the digital PLL 810 may have relatively simple structure, reduced lock time and high operating speed, and may accurately lock a phase and a frequency of the output signal FOUT. The internal circuit 820 operates based upon the output signal FOUT. For example, the output signal FOUT may be used in the internal circuit 820 as a clock signal.

Figure 33:
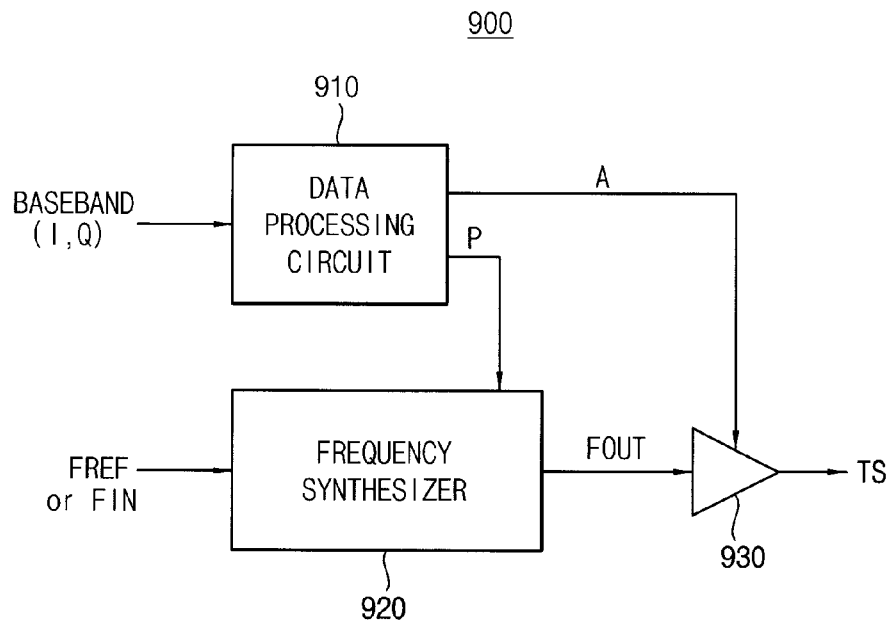
FIG. 33 is a block diagram illustrating a transmitter according to an exemplary embodiment.

FIG. 33 is a block diagram illustrating a transmitter according to an exemplary embodiment. A transmitter 900 includes a data processing circuit 910, a frequency synthesizer 920 and a power amplifier 930.

The data processing unit 910 processes baseband data BASEBAND including an in-phase signal I and a quadrature signal Q to convert the processed baseband data BASEBAND to an amplitude signal A and a phase signal P. In an exemplary embodiment, the data processing unit 910 may be implemented with a coordinate rotational digital computer (CORDIC), and the data processing unit 910 may convert the baseband data BASEBAND represented as coordinate components on the I-signal axis and the Q-signal axis to the amplitude component (i.e., the amplitude signal A) and the phase component (i.e., the phase signal P).

The frequency synthesizer 920 generates an output signal FOUT based upon the phase signal P and one of a reference signal FREF and an input signal FIN. In an exemplary embodiment, the frequency synthesizer 920 may include an adder for adding one of the reference signal FREF and the input signal FIN to the phase signal P, and a digital PLL for generating the output signal FOUT based upon the added signal. The digital PLL included in the frequency synthesizer 920 may be one of the digital PLL 500 of FIG. 26, the digital PLL 600 of FIG. 28 and the digital PLL 700 of FIG. 30. For example, the digital PLL may have a relatively simple structure, a reduced lock time and high operating speed, and may accurately lock a phase and a frequency of the output signal FOUT.

The power amplifier 930 synthesizes the output signal FOUT with the amplitude signal A to generate a transmission signal TS. For example, the power amplifier 930 may receive the output signal FOUT, and may provide the transmission signal TS having output levels according to the amplitude signal A.

Figure 34:
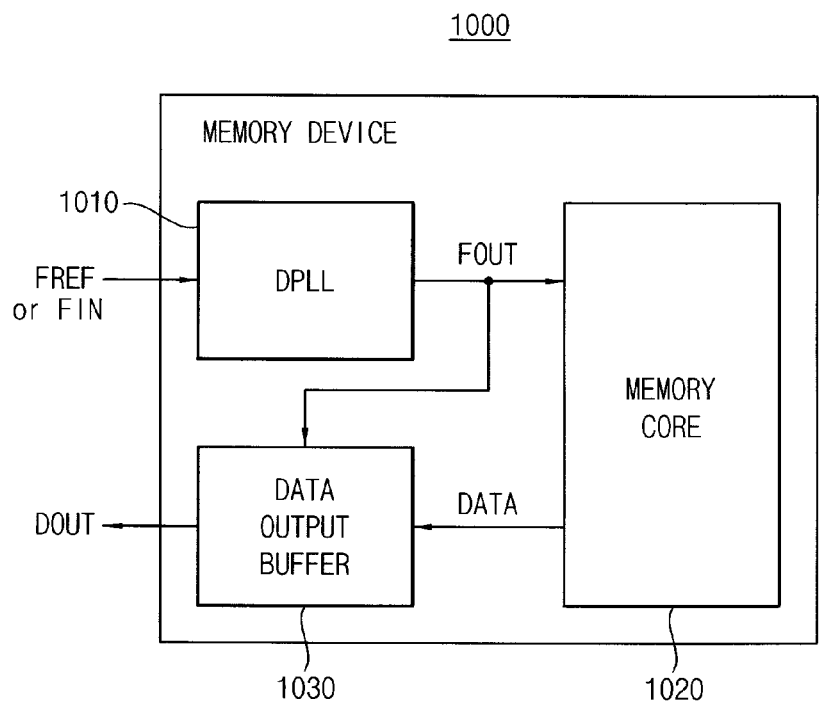
FIG. 34 is a block diagram illustrating a memory device according to an exemplary embodiment.

FIG. 34 is a block diagram illustrating a memory device according an exemplary embodiment. A memory device 1000 includes a digital PLL 1010, a memory core 1020 and a data output buffer 1030. In some exemplary embodiments, the memory device 1000 may be one of various memory devices, such as a dynamic random access memory (DRAM) device, a static random access memory (SRAM) device, a DDR synchronous DRAM (SDRAM), a graphic DDR (GDDR) SDRAM, an erasable programmable read-only memory (EPROM) device, an electrically erasable programming read-only memory (EEPROM) device, a flash memory device, etc.

The PLL 1010 generates an output signal FOUT based upon one of a reference signal FREF and an input signal FIN, and maintains the output signal FOUT at a locked phase and a locked frequency. The PLL 1010 may be one of the digital PLL 500 of FIG. 26, the digital PLL 600 of FIG. 28 and the digital PLL 700 of FIG. 30. For example, the digital PLL 1010 may have a relatively simple structure, a reduced lock time and a high operating speed, and may accurately lock a phase and a frequency of the output signal FOUT.

The memory core 1020 stores input data provided from a data input buffer (not illustrated) as write data, and provides read data DATA to the data output buffer 1030 based upon the stored write data. The memory core 1020 performs such writing and reading operations based upon the output signal FOUT. In an exemplary embodiment, the memory core 1020 may include a memory cell array (not illustrated) having a plurality of memory cells that store data, a row decoder (not illustrated) for selecting a word line of the memory cell array by decoding a row address, a column decoder (not illustrated) for selecting at least one bit line of the memory cell array by decoding a column address, and a sense amplifier (not illustrated) for generating the read data DATA by sensing the data stored in selected memory cells.

The data output buffer 1030 transfers the read data DATA as output data DOUT to a data input/output (I/O) pin (not illustrated) based upon the output signal FOUT. For example, the output data DOUT may be in synchronization with the output signal FOUT, and may be provided to an external device, such as a memory controller.

Figure 35:
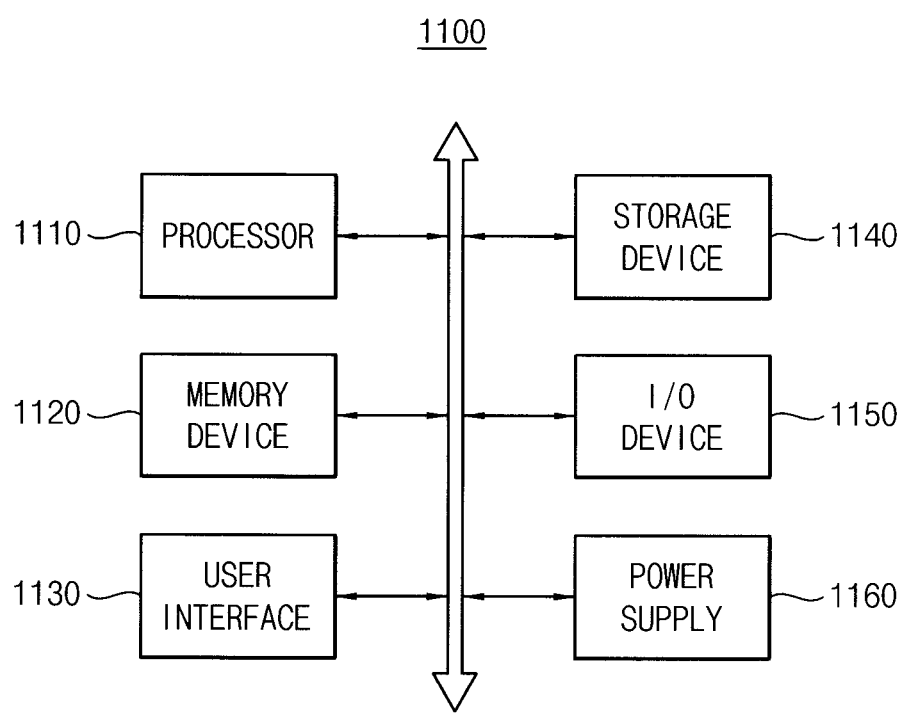
FIG. 35 is a block diagram illustrating an electronic system according to an exemplary embodiment.

FIG. 35 is a block diagram illustrating an electronic system according to an exemplary embodiment. The electronic system 1100 includes a processor 1110, a memory device 1120, an user interface 1130, a storage device 1140, an I/O device 1150 and a power supply 1160. Although not illustrated in FIG. 35, the electronic system 1100 may further include a plurality of ports for communicating a video card, a sound card, a memory card, a universal serial bus (USB) device, other electric devices, etc. The electronic system 1100 may further include a baseband chipset, an application chipset, an image sensor, etc.

The processor 1110 performs various computing functions. The processor 1110 may be a microprocessor, a CPU, etc. The processor 1110 may be connected to the memory device 1120, the user interface 1130, the storage device 1140, and the I/O device 1150 via a bus such as an address bus, a control bus, a data bus, etc. The processor 1110 may be connected to an extended bus such as a peripheral component interconnection (PCI) bus.

In an exemplary embodiment, the processor 1110 may be implemented with a single-core processor or a multi-core processor, such as a dual-core processor, a quad-core processor, a hexa-core processor, etc. For example, assuming that the processor 1110 is an ARM processor, the processor 1110 may be implemented with the single-core processor when the processor 1110 operates with relatively low speed (e.g., lower than about 1 GHz), and may be implemented with the multi-core processor when the processor 1110 operates with relatively high speed (e.g., higher than about 1 GHz). For example, the multi-core ARM processor may be connected to the peripheral devices (e.g., the memory device 1120, the user interface 1130, the storage device 1140, and the I/O device 1150) via an advanced extensible interface (AXI) bus.

The memory device 1120 stores data for operations of the electronic system 1100. The memory device 1120 may be the memory device 1000 of FIG. 34. For example, the memory device 1120 may include a digital PLL that generates an output signal based upon an input signal, and maintains the output signal at a locked phase and a locked frequency. The digital PLL may have relatively simple structure, reduced lock time and high operating speed, and may accurately lock a phase and a frequency of the output signal.

The user interface 1130 includes various means for interconnecting an user and the electronic system 1100. The storage device 1140 includes a solid state drive device, a hard disk drive device, a CD-ROM device, etc. The I/O device 1150 includes input devices such as a keyboard, a keypad, a mouse, etc, and output devices such as a printer, a display device, etc. The power supply 1160 provides a power for operations of the electronic system 1100.

The above described embodiments may be applied to various circuits and/or devices including a digital PLL, and an electronic system having the circuits and/or devices. Thus, the present inventive concept may be applied to a system, such as a desktop computer, a laptop computer, a digital camera, a video camcorder, a cellular phone, a smart phone, a portable multimedia player (PMP), a personal digital assistant (PDA), an MP3 player, a digital television, a solid state drive (SSD), a navigation device, an application processor (AP), a microprocessor, a central processing unit (CPU), an application-specific integrated circuit (ASIC), a mobile system on chip (SoC), a multimedia SoC, a smartcard, etc.

The foregoing is illustrative of exemplary embodiments and is not to be construed as limiting thereof. Although exemplary embodiments have been described, those skilled in the art will readily appreciate that many modifications are possible to the exemplary embodiments, and that the exemplary embodiments disclosed, modifications to the exemplary embodiments, as well as other exemplary embodiments, are intended to be included within the scope of the appended claims.

What is claimed is:

1. A digital phase frequency detector (PFD) comprising:
    a detection unit configured to detect an edge of a reference signal and an edge of a feedback input signal to generate a reference edge signal and a feedback edge signal;
    a reset unit configured to generate a reset signal that resets the detection unit based upon the reference edge signal and the feedback edge signal; and
    a phase comparison unit configured to generate a first phase comparison signal and a second phase comparison signal based upon the reference edge signal and the feedback edge signal, the phase comparison unit comprising:
        a first flip-flop having a data input terminal configured to receive the reference edge signal and a clock input terminal configured to receive the feedback edge signal, and configured to generate a first comparison signal based upon the reference edge signal and the feedback edge signal;
        a second flip-flop having a data input terminal configured to receive the feedback edge signal and a clock input terminal configured to receive the reference edge signal, and configured to generate a second comparison signal based upon the reference edge signal and the feedback edge signal; and
        a latch block configured to latch the first comparison signal and the second comparison signal to generate the first phase comparison signal and the second phase comparison signal.

2. The digital PFD of claim 1,
    wherein activation of the first phase comparison signal and the second phase comparison signal complement each other, and
    wherein the first phase comparison signal is activated when a phase of the feedback input signal lags a phase of the reference signal, and the second phase comparison signal is activated when a phase of the feedback input signal leads a phase of the reference signal.

3. The digital PFD of claim 2,
    wherein the first phase comparison signal is synchronized with the feedback edge signal such that a logic level of the first phase comparison signal is determined corresponding to a logic level of the reference edge signal at an activation timing of the feedback edge signal, and the second phase comparison signal is synchronized with the reference edge signal such that a logic level of the second phase comparison signal is determined corresponding to a logic level of the feedback edge signal at an activation timing of the reference edge signal, and
    wherein the reset signal is activated when both the reference edge signal and the feedback edge signal are activated, and the reference edge signal and the feedback edge signal are deactivated after the reset signal is activated.

4. The digital PFD of claim 1, wherein the detection unit comprises:
    a third flip-flop configured to generate the reference edge signal based upon the reference signal and the reset signal, the reference edge signal being activated in response to one of a rising edge and a falling edge of the reference signal and being deactivated in response to the reset signal; and
    a fourth flip-flop configured to generate the feedback edge signal based upon the feedback input signal and the reset signal, the feedback edge signal being activated in response to one of a rising edge and a falling edge of the feedback input signal and being deactivated in response to the reset signal.

5. The digital PFD of claim 1, wherein the reset unit comprises at least one logic element configured to perform a logic operation on the reference edge signal, the feedback edge signal and a detection enable signal to generate the reset signal.

6. The digital PFD of claim 1, further comprising a synchronization unit configured to synchronize the first phase comparison signal and the second phase comparison signal with one of the reference signal and the feedback input signal to generate a first phase comparison output signal and a second phase comparison output signal.

7. The digital PFD of claim 6, wherein the synchronization unit comprises:
    a third flip-flop having a data input terminal configured to receive the first phase comparison signal and a clock input terminal configured to receive the one of the reference signal and the feedback input signal, and configured to generate the first phase comparison output signal based upon the first phase comparison signal and the one of the reference signal and the feedback input signal; and
    a second flip-flop having a data input terminal configured to receive the second phase comparison signal and a clock input terminal configured to receive the one of the reference signal and the feedback input signal, and configured to generate the second comparison output signal based upon the second phase comparison signal and the one of the reference signal and the feedback input signal.

8. A digital phase frequency detector (PFD) comprising:
    a reference signal generation unit configured to generate a lead reference signal, a reference signal and a lag reference signal based upon an input signal;
    a phase comparison signal generation unit configured to generate a reference edge signal and a feedback edge signal based upon the reference signal and a feedback input signal, and configured to generate a first phase comparison signal and a second phase comparison signal based upon the reference edge signal and the feedback edge signal, the first and second phase comparison signals indicative as to whether a phase of the feedback input signal leads or lags a phase of the reference signal; and a gain control unit configured to generate a high gain signal based upon the lead reference signal, the lag reference signal, the reference edge signal and the feedback edge signal, the high gain signal indicative as to whether a phase difference between the reference signal and the feedback input signal is greater than a predetermined phase difference.

9. The digital PFD of claim 8, wherein a phase of the lead reference signal leads the phase of the reference signal, a phase of the lag reference signal lags the phase of the reference signal, and the high gain signal is activated when the phase of the feedback input signal leads the phase of the lead reference signal or lags the phase of the lag reference signal.

10. The digital PFD of claim 8, wherein the gain control unit comprises:
a lead detection unit configured to generate a high lead signal based upon the lead reference signal, the reference edge signal and the feedback edge signal, the high lead signal indicative as to the phase of the feedback input signal leads a phase of the lead reference signal;
a lag detection unit configured to generate a high lag signal based upon the lag reference signal, the reference edge signal and the feedback edge signal, the high lag signal indicative as to whether the phase of the feedback input signal lags a phase of the lag reference signal; and
a high gain signal generation unit configured to generate the high gain signal based upon the high lead signal and the high lag signal.

11. The digital PFD of claim 10, wherein the lead detection unit comprises:
a lead detection block configured to detect an edge of the lead reference signal to generate a lead edge signal;
a logic operation block configured to perform a logic operation on the lead edge signal, the reference edge signal and the feedback edge signal to generate a lead signal; and
a lead output block configured to synchronize the lead signal with the lead edge signal to generate the high lead signal.

12. The digital PFD of claim 10, wherein the lag detection unit comprises:
a lag detection block configured to detect an edge of the lag reference signal to generate a lag edge signal;
a logic operation block configured to perform a logic operation on the lag edge signal, the reference edge signal and the feedback edge signal to generate a lag signal; and
a lag output block configured to synchronize the lag signal with the lag edge signal to generate the high lag signal.

13. The digital PFD of claim 10, wherein the gain control unit further comprises a gain synchronization unit configured to synchronize the high gain signal with one of the reference signal and the feedback input signal to generate a high gain output signal.

14. The digital PFD of claim 8,
wherein the lead reference signal comprises first through n-th lead reference signals, where n is a natural number equal to or greater than two, and a phase of a k-th lead reference signal leads a phase of a (k−1)-th lead reference signal by an unit phase, where k is a natural number equal to or greater than two and equal to or less than n, and wherein the lag reference signal comprises first through n-th lag reference signals, and a phase of a k-th lag reference signal lags a phase of a (k−1)-th lag reference signal by the unit phase.

15. The digital PFD of claim 14, wherein the gain control unit comprises:
first through n-th lead detection units, each lead detection unit configured to generate a respective one of first through n-th high lead signals based upon a respective one of the first through n-th lead reference signals, the reference edge signal and the feedback edge signal, each high lead signal indicative as to whether the phase of the feedback input signal leads a phase of the respective one of the first through n-th lead reference signals;
first through n-th lag detection units, each lag detection unit configured to generate a respective one of first through n-th high lag signals based upon a respective one of the first through n-th lag reference signals, the reference edge signal and the feedback edge signal, each high lag signal indicative as to the phase of the feedback input signal lags a phase of the respective one of the first through n-th lag reference signals; and
first through n-th high gain signal generation units, each high gain signal generation unit configured to generate a respective one of first through n-th high gain signals based upon the respective one of the first through n-th high lead signals and the respective one of the first through n-th high lag signals.

16. The digital PFD of claim 8, wherein the phase comparison signal generation unit is configured to generate a reference edge signal and a feedback edge signal by detecting an edge of the reference signal and an edge of the feedback input signal, to synchronize the first phase comparison signal with the feedback edge signal such that a logic level of the first phase comparison signal corresponds to a logic level of the reference edge signal at an activation timing of the feedback edge signal, and to synchronize the second phase comparison signal with the reference edge signal such that a logic level of the second phase comparison signal corresponds to a logic level of the feedback edge signal at an activation timing of the reference edge signal.

17. The digital PFD of claim 8, further comprising:
a gain selection unit configured to generate a selection gain signal based upon the high gain signal, and based upon one of the first phase comparison signal and the second phase comparison signal, wherein the selection gain signal has a first digital value when the high gain signal is deactivated, and has a second digital value when the high gain signal is activated, a magnitude of the second digital value being greater than a magnitude of the first digital value.

18. A method of detecting a phase and a frequency of an output signal, the method comprising:
generating a lead reference signal, a reference signal and a lag reference signal based upon an input signal;
generating a reference edge signal and a feedback edge signal based upon the reference signal and a feedback input signal;
generating a high lead signal based upon the lead reference signal, the reference edge signal and the feedback edge signal, the high lead signal indicative as to a phase of the feedback input signal leads a phase of the lead reference signal;

generating a high lag signal based upon the lag reference signal, the reference edge signal and the feedback edge signal, the high lag signal indicative as to whether the phase of the feedback input signal lags a phase of the lag reference signal; and generating a high gain signal based upon the lead reference signal, the lag reference signal, the reference edge signal and the feedback edge signal, the high gain signal indicative as to whether the feedback input signal is compensated based upon an unit gain or an adjusted gain being greater than the unit gain.

19. The method of claim 18, wherein the high gain signal is activated when the phase of the feedback input signal leads the phase of the lead reference signal or lags the phase of the lag reference signal, and the method further comprising generating a selection gain signal based upon the high gain signal, wherein the selection gain signal corresponds to the adjusted gain when the high gain signal is activated and corresponds to the unit gain when the high gain signal is deactivated.

20. A digital phase locked loop (PLL) comprising:

a digital phase frequency detector (PFD) configured to generate a first phase comparison signal and a second phase comparison signal based upon a reference signal and a feedback input signal, the first and second phase comparison signals indicative as to whether a phase of the feedback input signal leads or lags a phase of the reference signal;

a digital loop filter configured to generate a digital control signal for adjusting a phase and a frequency of an output signal based upon the first phase comparison signal and the second phase comparison signal;

a digitally controlled oscillator configured to generate the output signal based upon the digital control signal; and a divider configured to divide the output signal to generate the feedback input signal, wherein the digital PFD comprises:
  a detection unit configured to detect an edge of the reference signal and an edge of the feedback input signal to generate a reference edge signal and a feedback edge signal;
  a reset unit configured to generate a reset signal to reset the detection unit based upon the reference edge signal and the feedback edge signal;
  a first flip-flop having a data input terminal configured to receive the reference edge signal and a clock input terminal configured to receive the feedback edge signal, and configured to generate a first comparison signal based upon the reference edge signal and the feedback edge signal;
  a second flip-flop having a data input terminal configured to receive the feedback edge signal and a clock input terminal configured to receive the reference edge signal, and configured to generate a second comparison signal based upon the reference edge signal and the feedback edge signal; and
  a latch unit configured to latch the first comparison signal and the second comparison signal to generate the first phase comparison signal and the second phase comparison signal.

21. A digital phase locked loop (PLL) comprising:

a digital phase frequency detector (PFD) configured to generate a lead reference signal, a reference signal and a lag reference signal based upon an input signal, to generate a reference edge signal and a feedback edge signal based upon the reference signal and a feedback input signal, to generate a first phase comparison signal and a second phase comparison signal based upon the reference edge signal and the feedback edge signal, and to generate a high gain signal based upon the lead reference signal, the lag reference signal, the reference edge signal and the feedback edge signal, the first and second phase comparison signals indicative as to whether a phase of the feedback input signal leads or lags a phase of the reference signal, and the high gain signal indicative as to whether a phase difference between the reference signal and the feedback input signal is greater than a predetermined phase difference;

a digital loop filter configured to generate a digital control signal for adjusting a phase and a frequency of an output signal based upon the high gain signal, the first phase comparison signal and the second phase comparison signal;

a digitally controlled oscillator (DCO) configured to generate the output signal based upon the digital control signal; and a divider configured to divide the output signal to generate the feedback input signal.

22. The digital PLL of claim 21, wherein an initial slope angle of a frequency versus time relationship of the output signal is greater than a final slope angle of frequency versus time relationship of the output signal.

23. The digital PLL of claim 21, further comprising:

an automatic frequency controller configured to generate an automatic digital control signal that adjusts an initial frequency of the output signal based upon the reference signal and the feedback input signal.

24. A digital phase frequency detector (PFD) for controlling a digital phase locked loop (PLL) comprising:

a phase comparison signal generation unit configured to generate a first phase comparison signal and a second phase comparison signal in response to a reference signal and a feedback signal of the PLL, the first phase comparison signal being indicative as to a phase of the feedback signal lagging the reference signal and the second phase comparison signal being indicative as to a phase of the feedback signal leading the phase of the reference signal;

a gain control unit configured to generate a high gain signal in response to a lead reference signal and a lag reference signal, the high gain signal being indicative as to whether a phase difference between the reference signal and the feedback signal is greater than a predetermined phase difference; and a gain selection unit configured to generate a selection gain signal based upon the high gain signal, and based upon one of the first phase comparison signal and the second phase comparison signal, wherein the selection gain signal has a first digital value when the high gain signal is deactivated, and has a second digital value when the high gain signal is activated, a magnitude of the second digital value being greater than a magnitude of the first digital value, wherein the first digital value and second digital value are configured to control an adjustment of a phase and frequency of an output signal and the feedback signal of the PLL.

\* \* \* \* \*